United States Patent
Choi et al.

(10) Patent No.: US 11,233,000 B2
(45) Date of Patent: Jan. 25, 2022

(54) SEMICONDUCTOR PACKAGE WITH INNER LEAD PATTERN GROUP AND METHOD FOR MANUFACTURING THE SEMICONDUCTOR PACKAGE

(71) Applicant: MagnaChip Semiconductor, Ltd., Cheongju-si (KR)

(72) Inventors: Jae Sik Choi, Cheongju-si (KR); Do Young Kim, Goyang-si (KR); Jin Won Jeong, Seoul (KR); Hye Ji Lee, Sejong-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 41 days.

(21) Appl. No.: 16/503,897

(22) Filed: Jul. 5, 2019

(65) Prior Publication Data

US 2020/0286817 A1    Sep. 10, 2020

(30) Foreign Application Priority Data

Mar. 5, 2019    (KR) .................... 10-2019-0025437

(51) Int. Cl.
*H01L 23/498*    (2006.01)
*H01L 23/528*    (2006.01)
*H01L 27/12*    (2006.01)

(52) U.S. Cl.
CPC .... *H01L 23/49816* (2013.01); *H01L 23/5283* (2013.01); *H01L 27/1244* (2013.01)

(58) Field of Classification Search
CPC ..................... H01L 23/49816; H01L 23/5283
See application file for complete search history.

(56) References Cited

U.S. PATENT DOCUMENTS

| 7,123,480 B1* | 10/2006 | Andoh ............... H01L 23/3128 361/704 |
| 9,332,649 B2 | 5/2016 | Kim et al. |
| 9,679,861 B1* | 6/2017 | Hool .................. H05K 1/0271 |
| 2002/0044423 A1* | 4/2002 | Primavera .......... H01L 23/5387 361/704 |

(Continued)

FOREIGN PATENT DOCUMENTS

| JP | 2013-239654 A | 11/2013 |
| KR | 10-2014-0062607 A | 5/2014 |

OTHER PUBLICATIONS

Korean Office Action dated Jul. 15, 2021, in Counterpart Korean Patent Application No. 10-2021-0078809 (6 pages in Korean).

*Primary Examiner* — Sitaramarao S Yechuri
(74) *Attorney, Agent, or Firm* — NSIP Law

(57) ABSTRACT

A semiconductor package includes a first metal interconnection disposed in a semiconductor chip, a first bump group configured to be connected to the first metal interconnection, a first inner lead pattern group configured to be connected to the first bump group, a second metal interconnection disposed in the semiconductor chip, a second bump group configured to be connected to the second metal interconnection; and a second inner lead pattern group configured to be connected to the second bump group, wherein a density of the first metal interconnection is greater than a density of the second metal interconnection, such that a first pitch of the first lead pattern group is greater than a second pitch of the second lead pattern group.

12 Claims, 27 Drawing Sheets

(56) References Cited

U.S. PATENT DOCUMENTS

| | | | |
|---|---|---|---|
| 2007/0080456 A1* | 4/2007 | Chang | H01L 23/49816 |
| | | | 257/738 |
| 2011/0169157 A1* | 7/2011 | Fan | H01L 23/49816 |
| | | | 257/692 |
| 2011/0256703 A1* | 10/2011 | Inohara | H01L 23/481 |
| | | | 438/586 |
| 2011/0291272 A1* | 12/2011 | Lin | H01L 24/05 |
| | | | 257/737 |
| 2012/0068350 A1* | 3/2012 | Kim | H01L 24/16 |
| | | | 257/773 |
| 2014/0084439 A1* | 3/2014 | Ihara | H01L 21/50 |
| | | | 257/684 |
| 2015/0008575 A1* | 1/2015 | Liu | H01L 24/14 |
| | | | 257/737 |
| 2016/0104692 A1 | 4/2016 | Lee et al. | |
| 2019/0296094 A1* | 9/2019 | Qin | H01L 27/3281 |

* cited by examiner

SEMICONDUCTOR PACKAGE WITH INNER LEAD PATTERN GROUP AND METHOD FOR MANUFACTURING THE SEMICONDUCTOR PACKAGE

CROSS-REFERENCE TO RELATED APPLICATIONS

This application claims the benefit under 35 U.S.C. 119(a) of Korean Patent Application No. 10-2019-0025437 filed on Mar. 5, 2019 in the Korean Intellectual Property Office, the entire disclosure of which is incorporated herein by reference for all purposes.

BACKGROUND

1. Field

The following description relates to a semiconductor package and more particularly, to a semiconductor package with inner lead pattern groups and a method for manufacturing the semiconductor package.

2. Description of Related Art

A display device may include a display panel for displaying an image and a semiconductor chip for driving each pixel of the display panel. The semiconductor chip may convert a video signal received from an external source into a driving signal suitable for driving each pixel, and apply the driving signal to each pixel at an appropriate time.

The semiconductor package may mount a semiconductor chip on a film substrate in a flip-chip manner and may be connected to an external circuit through an input/output pin connected to the pattern of the inner lead pattern on the film substrate.

Connection characteristics with electronic devices connected to semiconductor packages may be improved as the miniaturization, thinness, light weight, and high performance of electronic products have become more advanced.

In this regard, in typical semiconductor packages, there is a technique for specifically configuring an inner lead pattern for alignment when an outer lead bonding pattern of a semiconductor package and a display panel are connected. However, the connection between inner lead pattern and the display panel may be inadequate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor package includes a first metal interconnection disposed in a semiconductor chip, a first bump group configured to be connected to the first metal interconnection, a first inner lead pattern group configured to be connected to the first bump group, a second metal interconnection disposed in the semiconductor chip, a second bump group configured to be connected to the second metal interconnection; and a second inner lead pattern group configured to be connected to the second bump group, wherein a density of the first metal interconnection is greater than a density of the second metal interconnection, such that a first pitch of the first lead pattern group is greater than a second pitch of the second lead pattern group.

The first inner lead pattern group and the second inner lead pattern group may overlap the semiconductor chip.

The first inner lead pattern group and the second inner lead pattern group may be disposed on a flexible film.

A pitch of the first bump group may be equal to a pitch of the second bump group.

A thermal expansion coefficient of the semiconductor chip is smaller than a thermal expansion coefficient of the flexible film.

A number of lead patterns of the first inner lead pattern group may be equal to a number of lead patterns of the second inner lead pattern group.

A total length of the first bump group may be greater than a total length of the second bump group.

In a general aspect, a method for manufacturing a semiconductor package includes forming metal interconnections in a semiconductor chip, forming bumps connected to the metal interconnections, forming inner lead patterns disposed on a flexible film and connected to the bumps, such that the inner lead patterns overlap the semiconductor chip, wherein a pitch of the lead patterns increases as a density of the metal interconnections increases.

A total length of the inner lead patterns may increase as the density of the metal interconnections increases.

A space between the bumps may increase as the density of the metal interconnection increases.

In a general aspect, a semiconductor package includes: a semiconductor chip including a first chip region including a first bump group including one or more metal bumps formed on the semiconductor chip, first high density metal interconnections connected to the first bump group; and a first inner lead pattern group including one or more inner lead patterns connected to the one or more metal bumps of the first bump group; and a second chip region including a second bump group including one or more metal bumps formed on the semiconductor chip, second low density metal interconnections connected to the second bump group; and a second inner lead pattern group including one or more inner lead patterns connected to the one or more metal bumps of the second bump group.

A pitch between the first bump group and the second bump group varied based on the densities of the first metal interconnections and the second metal interconnections.

The first inner lead pattern group and the second inner lead pattern group may be formed on a flexible film.

The first inner lead pattern group and the second inner lead pattern group may be disposed to overlap the semiconductor chip.

A number of inner lead patterns of the first inner lead pattern group is different from a number of inner lead patterns of the second inner lead pattern group.

An increase of a distance between the inner lead patterns of the first inner lead pattern group may increase proportionately to an increase in a distance between the one or more metal bumps of the first bump group.

A coefficient of thermal expansion of the semiconductor chip may be greater than a coefficient of thermal expansion of the flexible film.

A pitch of the first inner lead pattern group is may be greater than a pitch of the second inner lead pattern group.

A pitch of the first bump group may be greater than a pitch of the second bump group.

Other features and aspects will be apparent from the following detailed description, the drawings, and the claims.

Figure 1A:
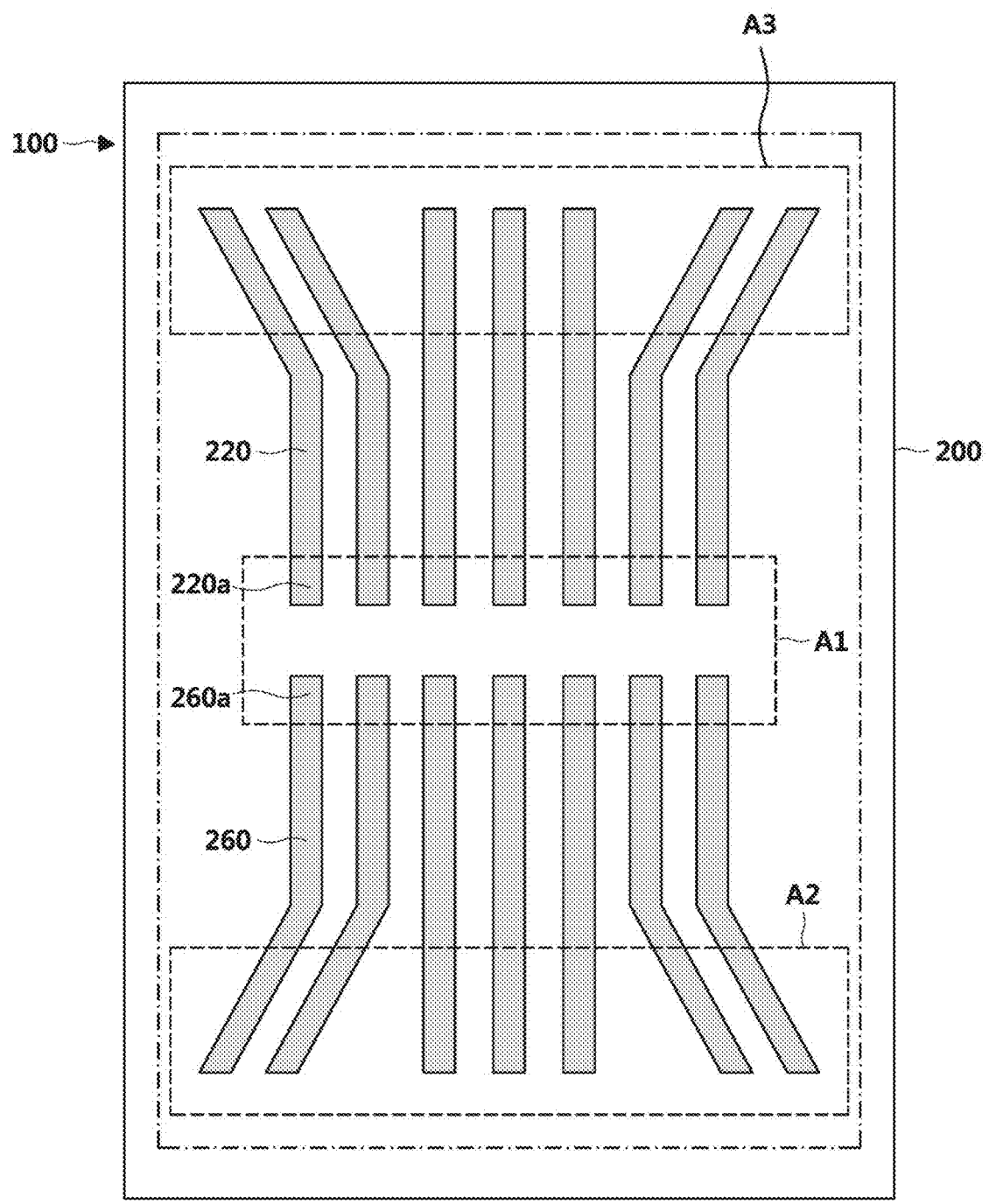
FIG. 1A is a plan view schematically illustrating an example of a semiconductor package according to one or more examples.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

The following description is provided to have an electrical short protection by preventing misalignment between the pattern of bumps of a semiconductor chip and the pattern of inner lead patterns of a film.

The following description is also provided to a display device that improves the reliability of the display device by preventing misalignment between inner lead bonding patterns of a film and the pattern of bumps of a semiconductor chip.

Figure 1B:
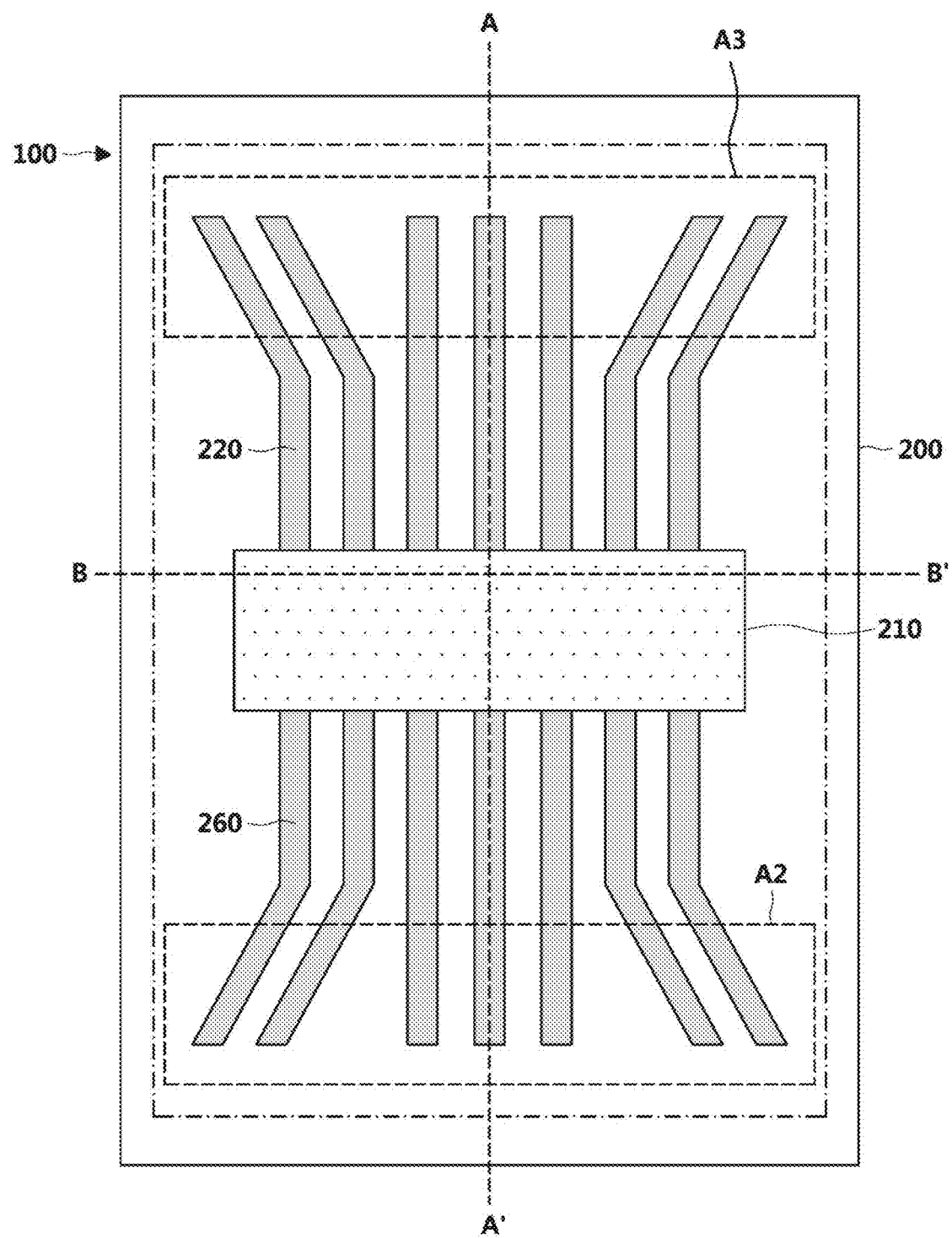
FIG. 1B is a plan view schematically illustrating an example of a semiconductor package after a semiconductor chip is mounted according to one or more examples.

FIG. 1A is a plan view schematically illustrating an example of a semiconductor package according to one or more embodiments, and FIG. 1B is a plan view schematically illustrating an example of a semiconductor package after mounting a semiconductor chip according to one or more embodiments.

The semiconductor package 100 of the example may be implemented as a chip on film (COF), a chip on plastic (COP), or a chip on glass (COG). Referring to FIG. 1A, a semiconductor package 100 includes a flexible film 200, an input wiring pattern 260 and an output wiring pattern 220 disposed on the flexible film 200. The flexible film 200 may be formed of an insulating material, for example, a material selected from a polymer group including polyimide (PI), and the like. However, the flexible film 200 is not limited to a polyimide film, and other flexible materials may be used, as appropriate.

Referring to FIG. 1B, the flexible film 200 is composed of an inner lead pattern area A1 (FIG. 1A) on which the semiconductor chip 210 is mounted and outer lead pattern areas A2 and A3 which may be attached to an external device and connected to an external circuit (not shown). The inner lead area A1 refers to an area overlapping the semiconductor chip 210 and the outer lead areas A2 and A3 may not overlap the semiconductor chip 210. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Referring to FIG. 1A, in the examples, the output wiring pattern 220a in the inner lead area A1 is referred to as output inner lead pattern, and the input wiring pattern 260a in the inner lead area A1 is referred to as input inner lead pattern 260a. For other expressions, the input inner lead pattern 260a and the output inner lead pattern 220a may be collectively referred to as input/output inner lead patterns or simply, inner lead patterns.

Each pattern of the input wiring patterns 260 and the output wiring patterns 220 may be formed in a band shape having a certain width, and a plurality of the input wiring patterns 260 and the output wiring patterns 220 may be arranged at regular distances from the inner lead area A1 toward the outer lead areas A2, A3.

In an embodiment illustrated in FIG. 1A and FIG. 1B, one or more of the input wiring patterns 260 and the output wiring patterns 220 may be arranged in parallel up to a certain region, or for a predetermined length of each of the input wiring patterns 260 and the output wiring patterns 220 from the inner lead area A1, and then may be bent in a certain angle in the outer lead areas A2 and A3. The plurality of input wiring patterns 260 and the plurality of output wiring patterns 220 may be arranged in a fanwise shape. However, according to another embodiment, the input wiring patterns 260 and the output wiring patterns 220 may be arranged in parallel in the outer lead areas A2 and A3 as well.

One end of the input wiring patterns 260 and one end of the output wiring patterns 220 may be disposed in the inner lead area A1, and may be spaced apart from each other by a certain distance in the inner lead area A1.

The input wiring patterns 260 and the output wiring patterns 220 may be formed of a single metal layer having good conductivity characteristics such as, but not limited to, gold, aluminum, or copper, or may be formed of a plurality of metal layers which is composed of two or more layers of these metals.

FIG. 1B is a plan view of the semiconductor chip 210 mounted on the inner lead area A1 of FIG. 1A. The semiconductor chip 210 may be, for example, a display driving chip, that may be a semiconductor chip or a driving chip for driving the display.

A first end of the input wiring patterns 260 may be located in the inner lead area A1, and may be electrically connected to the input bump of the semiconductor chip 210, and a second end of the input wiring patterns 260 may be located in the first outer lead area A2, and may be electrically connected to an external printed circuit board (PCB) wiring.

A first end of the output wiring pattern 220 may be located in the inner lead area A1, and may be electrically connected to the output bump of the semiconductor chip 210, and a second end of the output wiring pattern 220 may be located in the second outer lead area A3, and may be electrically connected to a gate pad or a data pad formed on a display panel.

The input wiring patterns 260 may be formed on the first surface of the flexible film 200, and may be electrically connected to the semiconductor chip 210 to apply a signal to the semiconductor chip 210 from an external PCB. The output wiring pattern 220 may be electrically connected to the display panel and may supply a signal that is output from the semiconductor chip 210 to the display panel.

Figure 2:
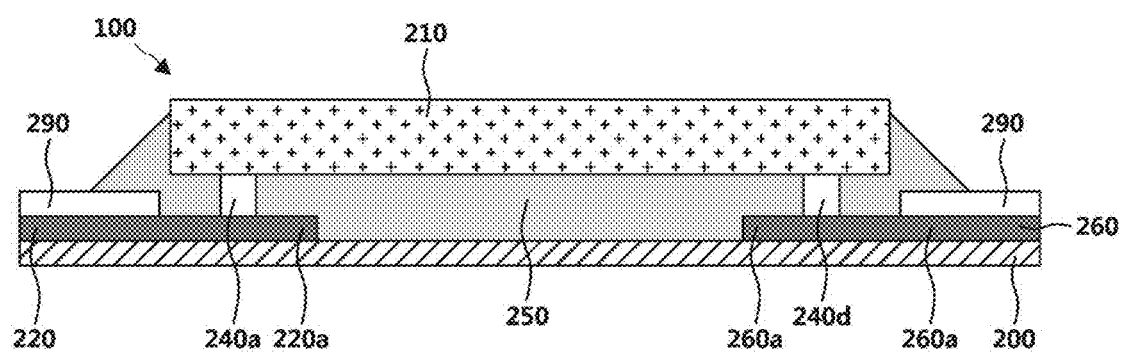
FIG. 2 is a cross-sectional view of the semiconductor package of FIG. 1B taken along the line A-A'.

FIG. 2 is a cross-sectional view of the semiconductor package of FIG. 1B taken along the line A-A'.

Referring to FIG. 2, the semiconductor package 100 may include a flexible film 200, inner lead patterns 220 and 260, metal bumps 240a and 240d, a semiconductor chip 210, a protective layer 290 and an insulating film 250.

The semiconductor chip 210 may be formed on the flexible film 200. The metal bumps 240a and 240d may be disposed between the semiconductor chip 210 and the input/output inner lead patterns to connect the semiconductor chip 210 and each of the inner lead patterns. The output metal bump 240a may be connected to the output inner lead pattern 220a. The input metal bump 240d may be connected to the input inner lead pattern 260a. The distances between the bumps, and between the semiconductor chip 210 and the flexible film 200, may be filled with an underfill material 250 for insulation. As the underfill material, a material having an insulating property, for example, a polymer resin may be used. In order to protect the surfaces of the output wiring 220 and the input wiring 260, a protective layer 290 of an insulating film system is formed on the surface of wiring in the region that is not overlapping the semiconductor chip 210.

Figure 3:
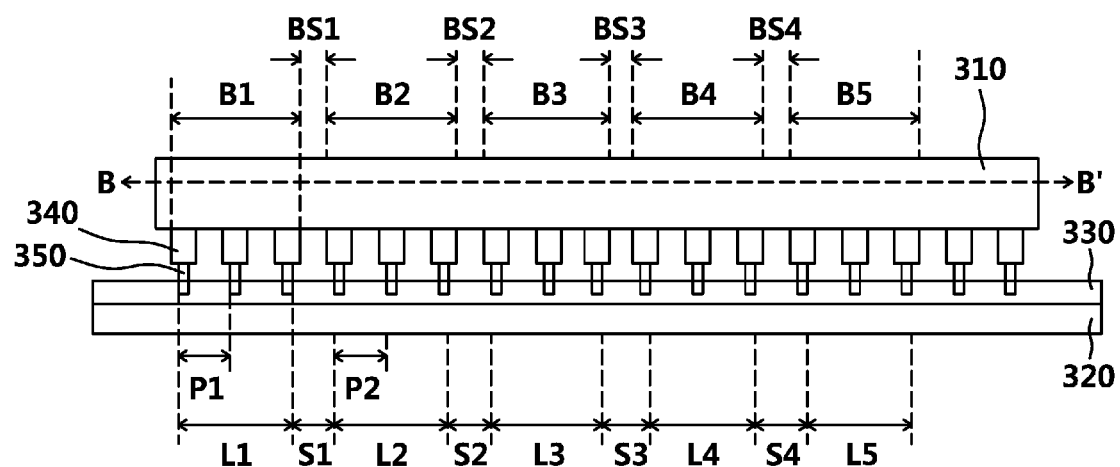
FIG. 3 is a cross-sectional view of the semiconductor package of FIG. 1B taken along the line B-B'.

FIG. 3 is a cross-sectional view of the semiconductor package of FIG. 1B taken along the line B-B'.

Referring to FIG. 3, the semiconductor package may include a semiconductor chip 310, a flexible film 320, an insulating layer 330 formed on the upper surface of the flexible film 320, bumps 340 and inner lead patterns 350 attached to the underside of the semiconductor chip 310. One end of the inner lead patterns 350 is connected to the insulating layer 330 and the other end of the inner lead pattern 350 is connected to the bumps 340. The metal bumps 340 may be formed into a plurality of bump groups B1 to B5 spaced apart from each other at predetermined distances.

The distances between one bump group and another bump group are denoted by distances BS1 to BS4.

In FIG. 3, B1, B2, B3, B4, and B5 refer to each bump group, but may also refer to the length of each bump group. That is, B1 is the length of the first bump group B1. In the first bump group B1, for example, three lead patterns 350 may be included, and B1 is a distance (or space) between the beginning portion and the end portion of the total of three lead patterns. Similarly, B2 is the length of the second bump group B2, B3 is the length of the third bump group B3, and B4 is the length of the fourth bump group B4. On the other hand, although three lead patterns are used as an example to describe the length of the bump group, it is apparent that, according to various embodiments, at least two lead patterns may be included in one bump group.

In the following description, the total length of the first bump group is B1+BS1. Similarly, the total length of the second bump group is B2+BS2, the total length of the third bump group is B3+BS3, and the total length of the fourth bump group is B4+BS4.

The semiconductor package may include a first inner lead pattern group L1 connected to the first bump group B1, a second inner lead pattern group L2 connected to the second bump group B2, a third inner lead pattern group L3 connected to the third bump group B3 and a fourth inner lead pattern group L4 connected to the fourth bump group B4. The first, second, third, and fourth inner lead pattern groups may all be disposed to overlap the semiconductor chip 310.

Here, L1, L2, L3 and L4 denote the respective inner lead pattern group and also the length of the inner lead pattern group. That is, L1 is the length of the first inner lead pattern group L1.

The first inner lead pattern group L1 may include three lead patterns 350 according to an embodiment, and L1 is the distance between the beginning of the first lead pattern and the end last lead pattern of the three lead patterns. Similarly, L2 is the length of the second inner lead pattern group L2, L3 is the length of the third inner lead pattern group L3, and L4 is the length of the fourth inner lead pattern group L4. In the examples, the total length of the first inner lead pattern group is L1+S1. Similarly, the total length of the second inner lead pattern group is L2+S2, the total length of the third inner lead pattern group is L3+S3, and the total length of the fourth inner lead pattern group is L4+S4.

As shown in FIG. 3, the lengths of B1 and L1 may not be equal to each other. B1 is based on one end of each bump, and L1 is based on one end of each lead pattern.

According to an example, the semiconductor chip 310 may be attached to the flexible film 320 using a thermal compression bonding method. An electrical short might be caused because the semiconductor chip 310 and the flexible film 320 are partially expanded so that the bumps 340 and the inner lead patterns 350 are misaligned.

If the misalignment phenomenon occurs, the current may not flow. Accordingly, the driver IC 310 may not operate normally. The misalignment is caused by the difference in coefficient of thermal expansion (CTE) between the semiconductor chip 310 and the flexible film 320.

During the COF package process, a COF packaging process at high temperature may be necessary. The semiconductor chip 310 and the flexible film 320 are laterally extended during the packaging process. The misalignment may occur between the bumps attached to the semiconductor chip 310 and the inner lead pattern 350 of the flexible film 320. Accordingly, the difference in CTE between the semiconductor chip 310 and the flexible film 320 should be considered in order to prevent misalignment between the bumps and the lead patterns. The extent of lateral extension in the semiconductor chip 310 depends on a density of the metal interconnection lines which are electrically connected to the bumps.

Figure 4A:
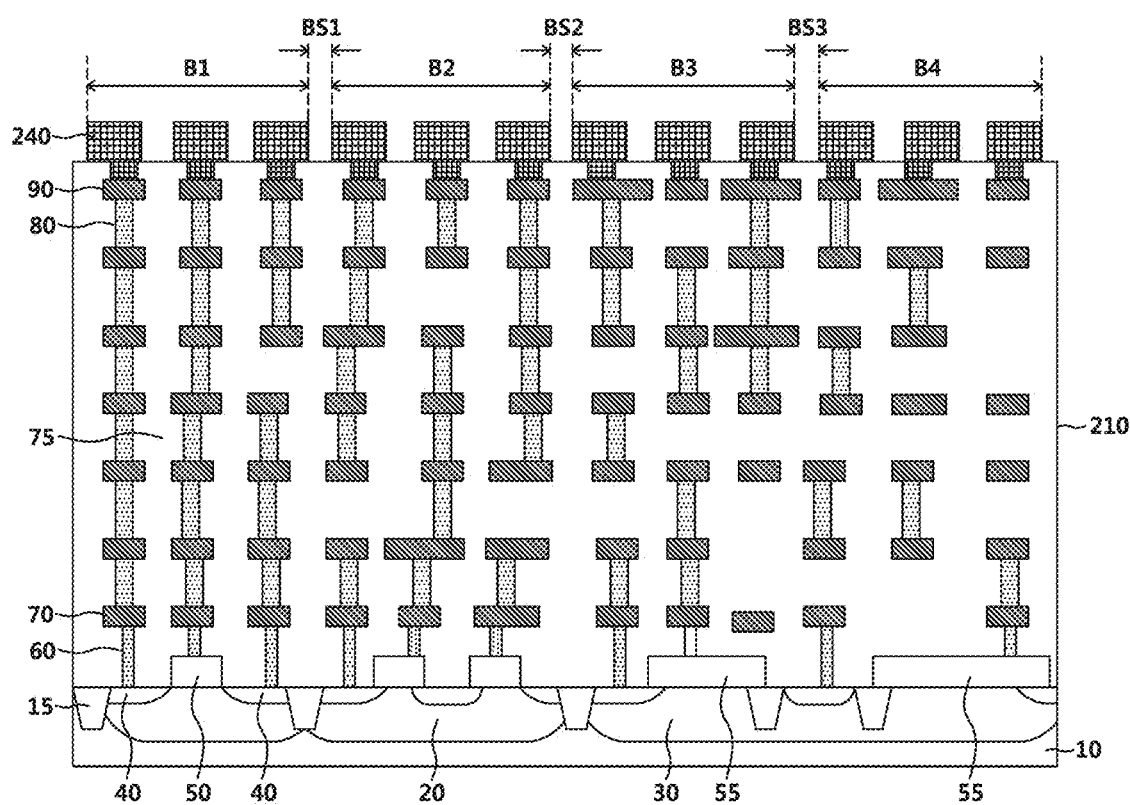
FIG. 4A is a cross-sectional view of an example of a semiconductor chip and a bump array according to one or more examples.

FIG. 4A is a cross-sectional view of a semiconductor chip and a bump array according to an example.

In FIG. 4A, the semiconductor chip 210 includes an isolation region 15 formed in the substrate 10, a well region 20, a drift region 30, a source/drain region 40, a CMOS gate electrode 50, and an LDMOS gate electrode 55.

Additionally, the semiconductor chip 210 may include a plurality of contact plugs 60, a plurality of first metal interconnections 70, an interlayer insulating film 75, a plurality of vias 80, and a plurality of metal pads 90.

The metal bump 240 is connected to the metal pad 90 of the semiconductor chip 210. In the present specification, a plurality of metal interconnections 70, 80 and 90 include the plurality of first metal interconnections 70, the plurality of metal pads 90, and all the metal interconnections therebetween including the plurality of vias 80.

In the vertical cross-sectional direction of the semiconductor chip 210, the metal interconnection density per unit area may be variable in consideration of the coefficient of thermal expansion. For example, in FIG. 4A, the density of the plurality of metal interconnections 70, 80, and 90 per unit area in the vertical cross-sectional direction of the semiconductor chip 210 tends to decrease from left to right. The lower the density of the metal interconnections 70, 80 and 90, the larger the region occupied by the interlayer insulating film 75. Conversely, the higher the density of the metal interconnections 70, 80 and 90, the smaller the region occupied by the interlayer insulating film 75. Depending on the density of the metal interconnections, the distances between the metal bumps 240 may be affected during the packaging process.

The semiconductor package may include a plurality of bump groups B1, B2, B3 and B4. The distances between the bump groups are denoted by distances BS1, BS2 and BS3. A distance or a space between the bumps varies based on the COF packaging process.

Figure 4B:
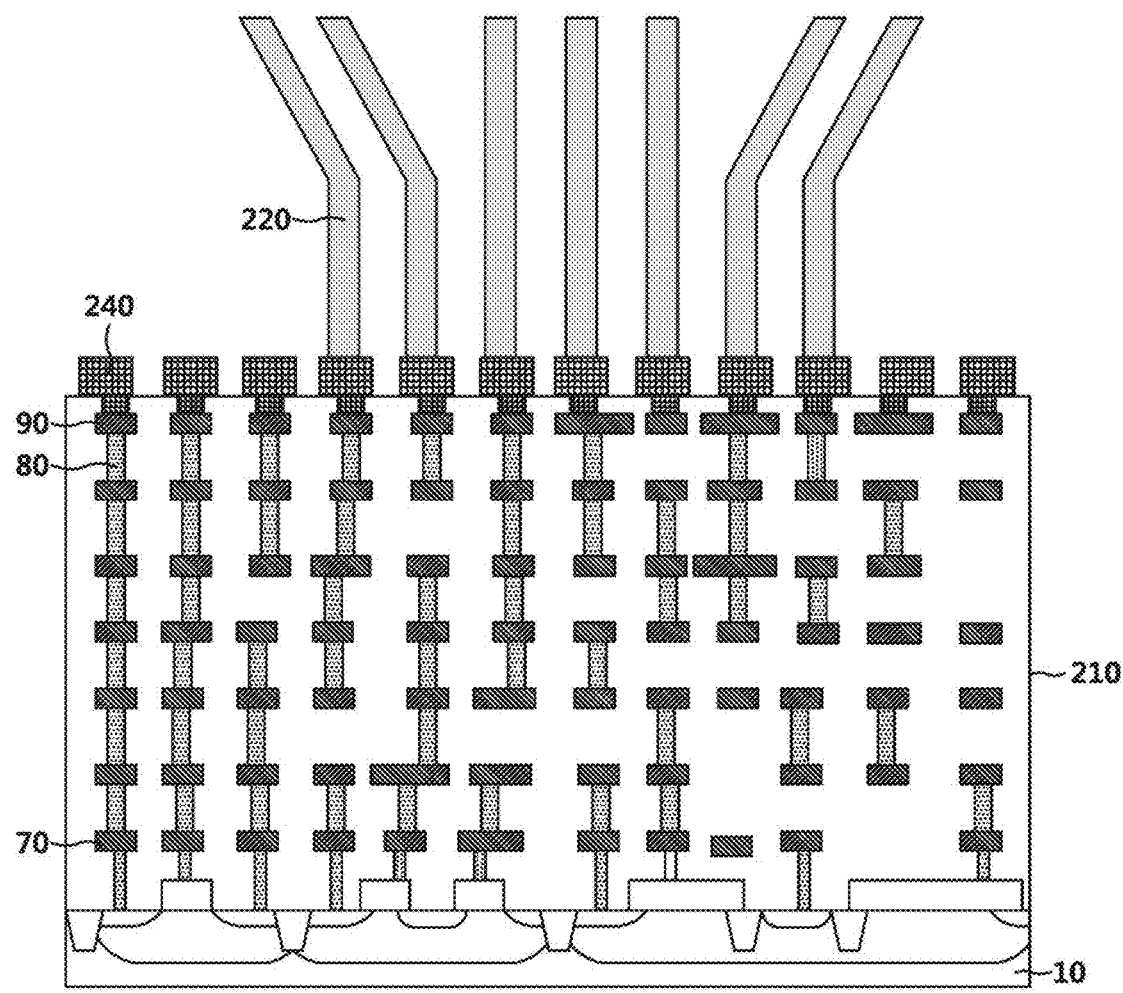
FIG. 4B illustrates an example of a connection between a semiconductor chip and output wiring according to one or more examples.

FIG. 4B illustrates a connection between the semiconductor chip and the output wiring, in which the metal bumps 240 formed on the semiconductor chip 210 of FIG. 4A are connected to the output wiring 220 disposed on the flexible film 200.

For example, a metal bump 240 and an output wiring 220 may be connected one to one. As another example, a dummy wiring may be added between an output wiring 220 and another output wiring 220.

In this example, the metal bump 240 and the output wiring 220 should be aligned on the right position so that the output signal from the semiconductor chip 210 may be transmitted, without interruption, to the display device (not shown) connected through the output wiring 220. If the metal bump 240 and the output wiring 220 or the output inner lead pattern 220a are misaligned, the signal may be delayed or interrupted, resulting in malfunction in driving the display device. In order to eliminate malfunctions, the distances shown in FIG. 4A may be adjusted to properly align the metal bumps with the output wiring or with the output inner lead pattern 220a so that there is no problem in connection. The same applies to the input inner lead pattern 260a.

Hereinafter, the output inner lead pattern 220a or the input inner lead pattern 260a, are collectively defined as the inner lead patterns 220a and 260a.

Since the output inner lead pattern 220a is formed more densely than the input inner lead pattern 260a in embodiments of the present disclosure, the output inner lead pattern 220a will be mainly explained. In general, the density of output related wiring pattern is much greater than the density of input related wiring pattern.

Figure 5A:
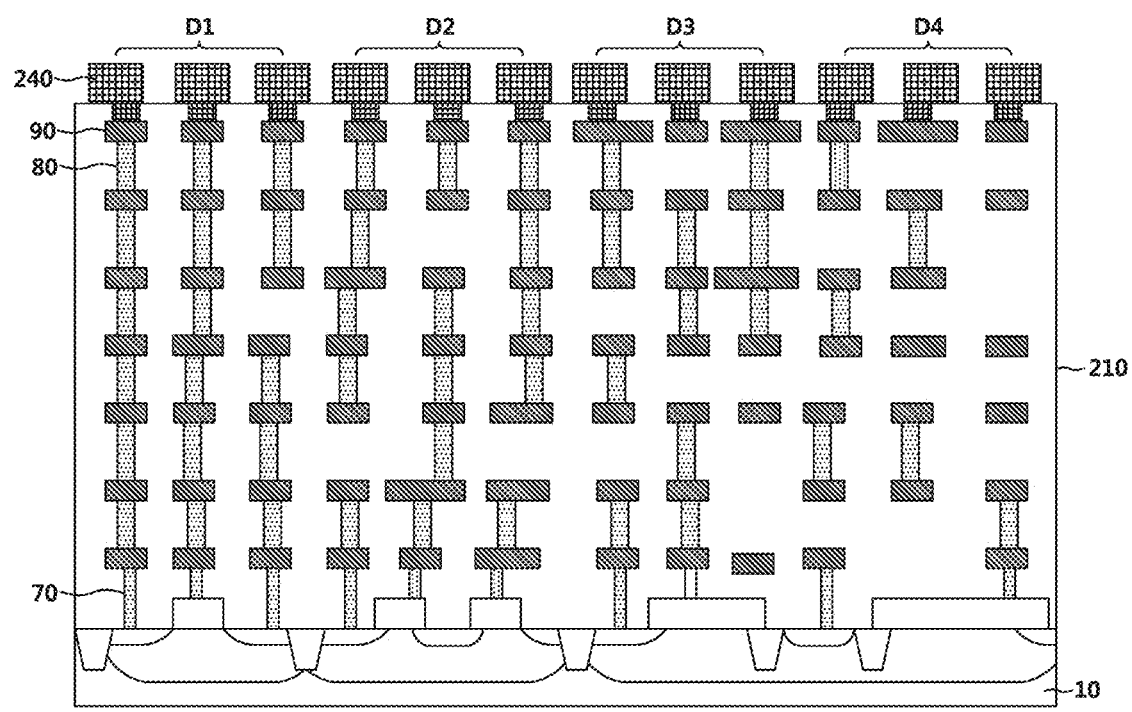
FIG. 5A illustrates an example of metal interconnection density of a chip in a semiconductor package according to one or more examples.
Figure 5B:
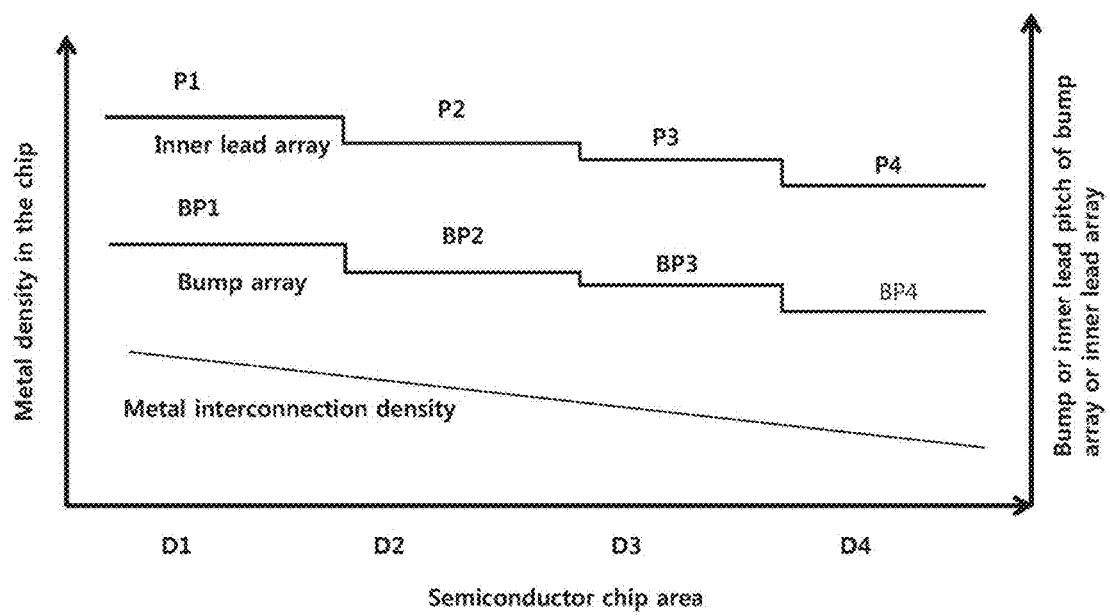
FIG. 5B is a graph illustrating an example of a change in the pitch BP with respect to the bump array or the pitch P of the inner lead pattern depending on the metal interconnection density of the semiconductor chip in the thermal expansion process in the semiconductor package according to one or more examples.

FIG. 5A illustrates an example of a metal interconnection density of a chip in a semiconductor package according to an embodiment of the present disclosure. FIG. 5B is a graph explaining the changes of the pitch with respect to the bump array BP or the pitch P of the inner lead pattern according to the metal interconnection density of the semiconductor chip during the thermal expansion process in a semiconductor package according to an embodiment of the present disclosure. For convenience of explanation, it is assumed that the metal interconnection density tends to decrease from left to right.

The high density of the metal interconnection means that the area occupied by the metal interconnection per unit area is large. The area of the interlayer insulating film is reduced by the area occupied by the metal interconnection. The metal interconnection density of the semiconductor chip 210 affects the metal bump array 240 and the inner lead pattern 220a during the bump COF packaging process.

Referring to FIG. 5A, the semiconductor chip 210 may have regions D1 to D4, that is, four regions that are based on the density of the metal interconnections 70, 80 and 90. Metal interconnection density gradually decreases from region D1 to region D4. That is, region D1 may include seven metal pad layers and vias connected to each layer. Region D4 may include six metal pad layers and vias connected to some of the metal pads only. The metal interconnection density in region D1 may be greater than the metal interconnection density in region D4. Therefore, considering the coefficient of thermal expansion (CTE) of the metal when the bump COF packaging process is applied, region D4 which has an area largely occupied by the interlayer insulating film, may be less expanded than region D1. This is because as the metal interconnection density increases, the thermal expansion length increases as well.

BP refers to the pitch for the bump array, that is, the distance between a bump and another bump. During the bump COF packaging process at a high temperature, the distances between the bumps BP1, BP2, BP3 and BP4 in each bump group may also vary according to the metal interconnection density per unit area. The distances BP1, BP2, BP3 and BP4 between the bumps in each bump group may vary so that the distances BP1, BP2, BP3 and BP4 become greater as metal interconnection density (D1>D2>D3>D4) increases. That is, BP1>BP2>BP3>BP4.

As the metal interconnection density increases, the area occupied by the interlayer insulating film 75 decreases. Accordingly, the distances between the bumps become greater. Conversely, as metal interconnection density decreases, the thermal expansion length decreases. When metal interconnection density is lower, the area occupied by the interlayer insulating film 75 becomes relatively large.

As the metal interconnection density increases, the distances between the bumps increase during the COF packaging process. The coefficient of thermal expansion is, for example, 3-5*1E-06/K for silicon and 25*1E-06/K for aluminum metal. On the other hand, the oxide film is about 0.5*1E-06/° C. The coefficient of thermal expansion of the oxide film is smaller than the coefficient of thermal expansion of silicon and aluminum metal. Therefore, the distance between the bumps formed in the low metal interconnection density region is smaller than the distances between the bumps formed in the high metal interconnection density region.

In the examples, the metal bumps 240 formed on the semiconductor chip 210 may all be disposed at uniform distances, and may be packaged before the COF packaging process. However, although initially disposed at regular distances, the distances of the metal bumps 240 may be increased during the COF packaging process due to the different coefficient of thermal expansion.

Accordingly, the distances P1 to P4 of the inner lead pattern connected one to one with the bump 240 may be adjusted as well. That is, as the metal interconnection density decreases or as the size of the area occupied by the interlayer insulating film increases, the distance BP of the metal bumps 240 and the distance of the inner lead patterns P decrease.

Referring to FIG. 3, since the inner lead patterns 350 are formed in the flexible film 320, when the flexible film 320 is expanded by the heat during COF packaging process, the distance of inner lead pattern 350 increase equally. Therefore, the distance of the inner lead patterns 350 may be determined based on the metal interconnection density 340. That is, the distance of the inner lead patterns existing in the flexible film may be determined based on the expansion of the flexible film during the COF packaging process. On the other hand, if the distance between the inner lead patterns is set too narrow or too wide, the inner lead patterns may not be properly aligned with the metal bumps.

Figure 6A:
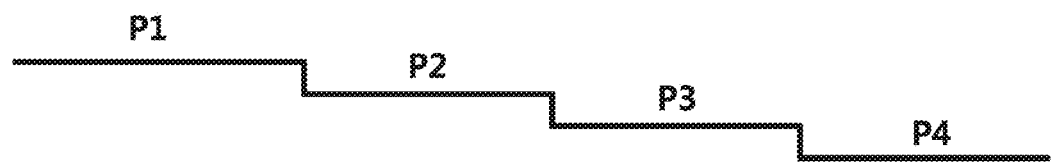
FIGS. 6A, 6B, and 6C illustrate an example of the pitches of inner lead patterns according to one or more examples.
Figure 6B:
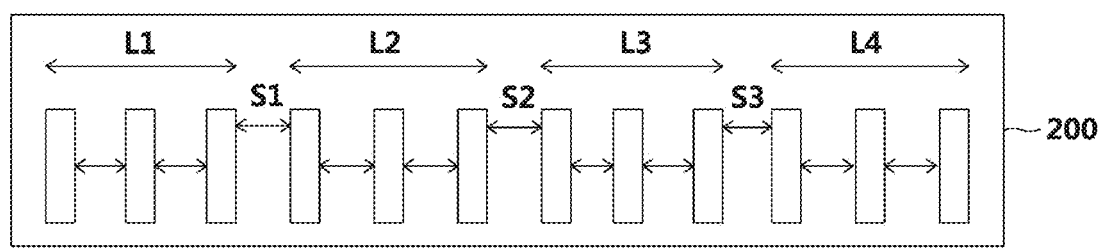
Figure 6C:
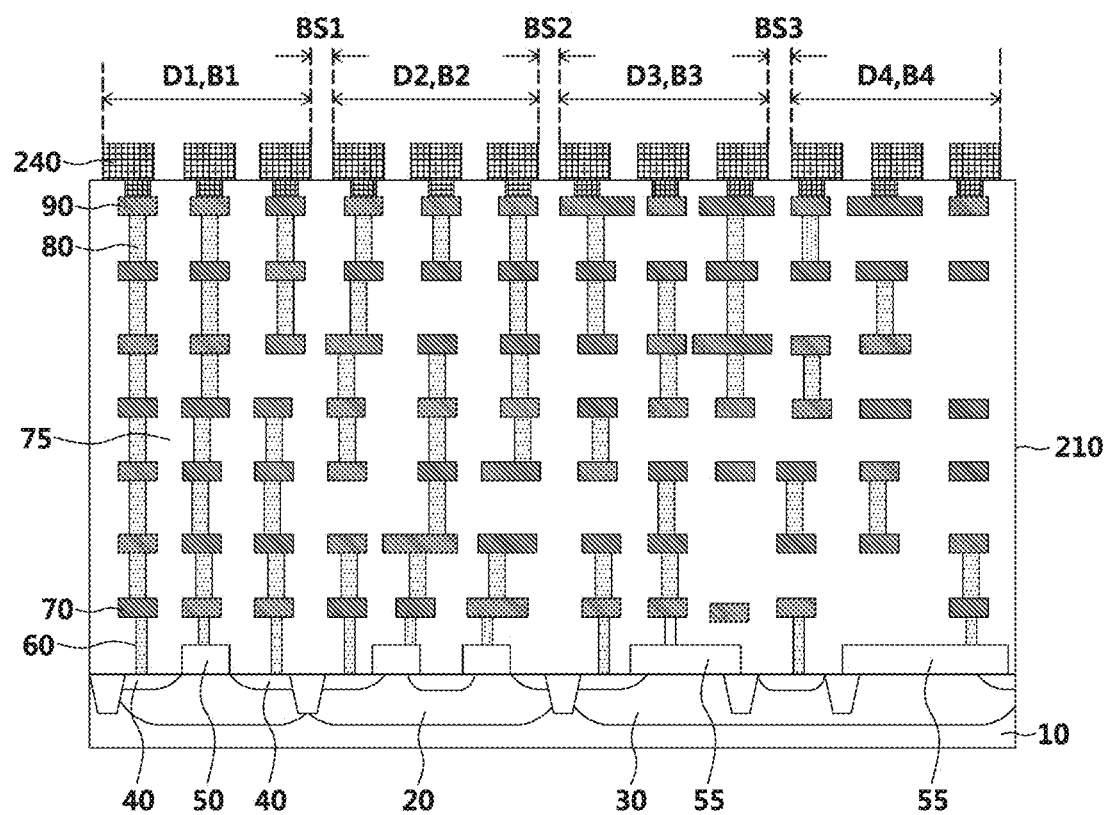

FIGS. 6A, 6B, and 6C are diagrams illustrating an example of the pitch of inner lead patterns according to an example. For convenience of explanation, only chip regions D1 and D2 will be mainly described. However, the following description may be applied equally to regions D3 and D4.

Assume that a semiconductor chip 210 has a high metal interconnection density region D1 and a low metal interconnection density region D2. The first bump group B1 may be formed in the high metal interconnection density region D1, and the first inner lead pattern region L1 may be connected to the first bump group B1. The second bump group B2 may be formed in the low metal interconnection density region D2, and the second inner lead pattern region L2 may be connected to the second bump group B2.

As illustrated in FIG. 6A and FIG. 6B, the total length P1 of the first inner lead pattern region L1 may be greater than the total length P2 of the second inner lead pattern region L2, because the thermal expansion length of the high metal interconnection density region D1 is greater than the low metal interconnection density region D2. The metal bump and the inner lead pattern may be aligned with each other properly by varying the pitches in advance during the manufacturing process.

On the other hand, the distance (pitch) of the inner lead patterns may be adjusted by simulating the metal interconnection density in advance. However, the actual result may be different. When packaging the semiconductor, firstly, distance (pitch) of the inner lead patterns may be disposed in a direction that increases at a constant rate. Then, the bumps of the semiconductor chip are attached to the inner lead pattern of the flexible film. Subsequently, observing the degree of misalignment, the inner lead pattern in which the distance (pitch) is readjusted is formed on the flexible film. Then, the bumps of the semiconductor chip are aligned to the inner lead pattern of the flexible film by being attached once again.

More specifically, in FIGS. 6B and 6C, the semiconductor package according to an example includes a semiconductor chip 210, a plurality of metal interconnections 70, 80, and 90 formed on the semiconductor chip 210, a first bump group B1 and a second bump group B2 connected to a plurality of the metal interconnections 70, 80 and 90. A first inner lead pattern group L1 is formed on the flexible film 200 and may be connected to the first bump group B1. A second inner lead pattern group L2 is formed on the flexible film 200, and may be connected to the second bump group B2. The first inner lead pattern group L1 and the second inner lead pattern group L2 may be disposed to overlap the semiconductor chip 210.

Although three inner lead patterns are illustrated as being included in each inner lead pattern group L1, L2, L3, ..., this is only an example. Each inner lead group may include less than three inner lead patterns or more than three inner lead patterns.

Here, L1, L2, L3, and L4 refers to each inner lead pattern group, but may also refer to the length of each inner lead pattern group. That is, L1 is the length of the first inner lead pattern group L1. Similarly, L2 is the length of the second inner lead pattern group L2, L3 is the length of the third inner lead pattern group L3, and L4 is the length of the fourth inner lead pattern group L4. The first inner lead pattern group L1, for example, may include three lead patterns 350 (FIG. 3), and L1 is the distance from a beginning portion to an end portion of the three lead patterns.

Thus, the total length of the first inner lead pattern group is calculated as L1+S1. Similarly, the total length of the second inner lead pattern group is calculated as L2+S2. The total length of the third inner lead pattern group is calculated as L3+S3. The total length of the fourth inner lead pattern group is calculated as L4+S4 (FIG. 3).

The density of the metal interconnection region D1 connected to the first bump group B1 may be greater than the density of the metal interconnection region D2 connected to the second bump group B2. If the number of inner lead patterns in the first inner lead pattern group L1 and the number of inner lead patterns in the second inner lead pattern group L2 are equal to each other, the total length of the first lead pattern group (L1+S1) formed on the high metal interconnection density region D1 may be determined to be greater than the total length of the second lead pattern group (L2+S2) formed on the low metal interconnection density region D2.

Here, S1 is the distance between the first lead pattern group L1 formed on the high metal interconnection density region D1 and the second lead pattern group L2 formed on the low metal interconnection density region D2. As a result, when S1=S2, the total length of the inner lead pattern groups is determined to be L1>L2. In order to design the total length of the inner lead pattern groups to be L1>L2, P1 is determined to be greater than P2, that is, P1>P2.

Referring to FIG. 6A and FIG. 6C, the density of the metal interconnections 70, 80, and 90 may decrease from a left to right direction. The pitch between the inner lead patterns varies to be P1>P2>P3>P4 with respect to the metal interconnection density.

The semiconductor package according to the example of FIG. 6 includes first region D1 of a semiconductor chip, that is, a first bump group B1 formed on the first region D1, second region D2 of the semiconductor chip, that is, a second bump group B2 formed on the second region D2, wherein the semiconductor chip includes an interlayer insulating film 75 formed on the substrate 10, and a plurality of metal interconnections 70, 80, and 90 formed on the interlayer insulating film 75, wherein the metal interconnection density per unit region of the first region D1 is greater than the metal interconnection density per unit region in the second region, and wherein the total length of the first bump group B1+BS1 is greater than the total length of the second bump group B2+BS2. The total lengths of the first bump group and the second bump group may be the same. However, the total length may be changed after the COF packaging process is applied.

Subsequently, the semiconductor package includes first and second inner lead pattern groups L1 and L2 formed on a flexible film 200 and connected to the first and second bump groups B1 and B2, respectively. The first and second inner lead pattern groups, of which the number of inner lead patterns is equal to each other, may be disposed to overlap the semiconductor chip 210, and the total length of the first inner lead pattern group L1 may be greater than the total length of the second inner lead pattern group L2.

Figure 7A:
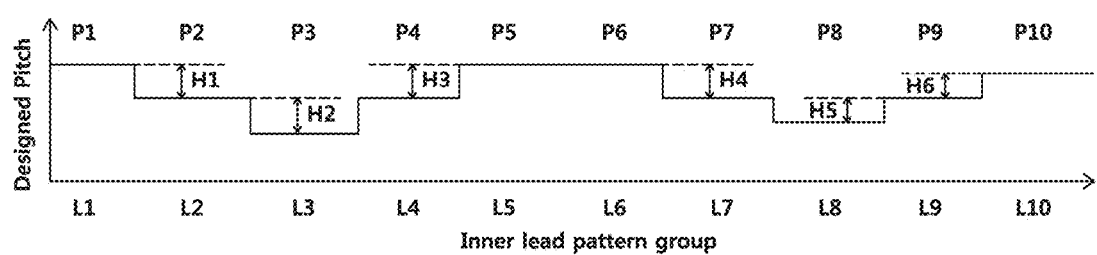
FIGS. 7A and 7B illustrate an example of the f pitches of the inner lead pattern in the semiconductor package according to one or more examples.
Figure 7B:
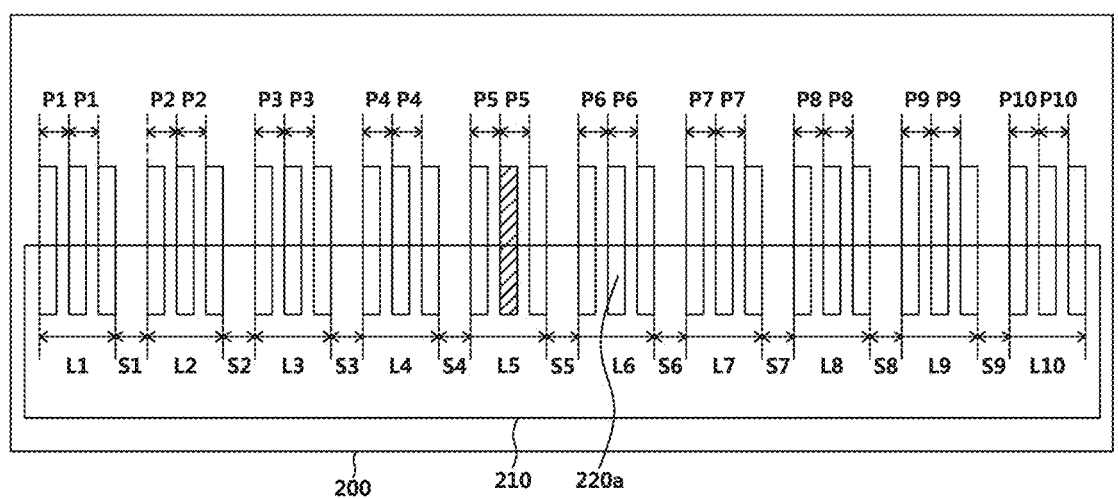

FIGS. 7A and 7B illustrate an example of a pitch of the inner lead pattern of the semiconductor package according to an example.

In FIGS. 7A and 7B, L1 to L10 represent first to tenth inner lead pattern groups. For example, as illustrated in FIG. 7B, three inner lead patterns are formed in each inner lead pattern group. However, this is only an example, and the number of lead patterns is not limited thereto.

Referring to FIGS. 7A and 7B, P1 to P10 may denote the pitch. Each pitch shows the distance from the beginning point of a first inner lead pattern in an inner lead pattern group to the beginning point of the next inner lead pattern in the same inner lead pattern group. The greater the pitch, the greater the distances between the inner lead patterns of the inner lead pattern group, and the total length L of the inner lead pattern group may increase as well.

Referring to FIG. 7B, S1 to S9 are distances between the inner lead pattern groups, for example, a distance, denoted as S1, is the distance between the first inner lead pattern group L1 and the second inner lead pattern group L2.

In FIGS. 7A and 7B, the semiconductor package, according to an example, includes first to tenth bump groups (not shown) formed on the semiconductor chip 210, and first to tenth inner lead pattern groups L1 to L10 formed on a flexible film and connected to the first to tenth bump groups. The inner lead pattern groups L1 to L10 may be disposed to overlap the semiconductor chip 210. The numbers of the inner lead patterns 220a in each inner lead pattern group may be equal to each other. However, this is only an example, and in other examples, the numbers of inner lead patterns in each inner lead pattern group may not be equal to each other.

The pitch (P) and the distance (S) of each inner lead pattern group may be variable. For example, the first pitch P1 of the first inner lead pattern group L1 may be greater than the second pitch P2 of the second inner lead pattern group. The second pitch P2 of the second inner lead pattern group may be greater than the third pitch P3 of the third inner lead pattern group. The third pitch P3 of the third inner lead pattern group may be smaller than the fourth pitch P4 of the fourth inner lead pattern group. The fourth pitch of the fourth inner lead pattern group L4 may be smaller than the fifth pitch P5 of the fifth inner lead pattern group L5. The fifth pitch P5 of the fifth inner lead pattern group L5 may be equal to the sixth pitch P6 of the sixth inner lead pattern group L6. That is, the pitch may be P1>P2>P3<P4<P5=P6>P7>P8<P9<P10.

This is because the densities of the metal interconnection regions in the semiconductor chip corresponding to the respective inner lead pattern regions may be different from each other. The graph of each pitch P1 to P10 may have a 'W' shape, as shown in FIG. 7A, or a 'M' shape in the opposite end. Except for the pitch values P5 and P6 for the two groups located at the center, the remaining P1 to P4 and P7 to P10 may have different values.

The pitches P1 to P10 for the respective groups in the first to tenth inner lead pattern groups may have different values. Each pitch represents the distance from the beginning of the first bump to the beginning of the second bump in each bump group. The greater the pitch, the greater the distance between the bumps. For example, when the pitch value P1 of group L1 is 30 um, the pitch value P2 of group L2 may have a different pitch value as 30.005 µm. In FIG. 7A, the differences in pitch values between adjacent groups are denoted by H1 to H6. For example, P1−P2=H1. Similarly, P2−P3=H2, P3−P4=H2, P4−P5=H3, P5−P6=0, P6−P7=H4, P7−P8=H5, P8−P9=H5 and P9−P10=H6.

A COF packaging process may be performed for one-to-one correspondence between the bumps of the semiconductor chip and the inner lead patterns of the flexible film. The semiconductor chip and the flexible film may expand or shrink due to the heat generated from the process. In the example, each distance between the bump in the semiconductor chip and the inner lead pattern on the flexible film may vary so that misalignment does not occur even after the COF packaging process.

Figure 8A:
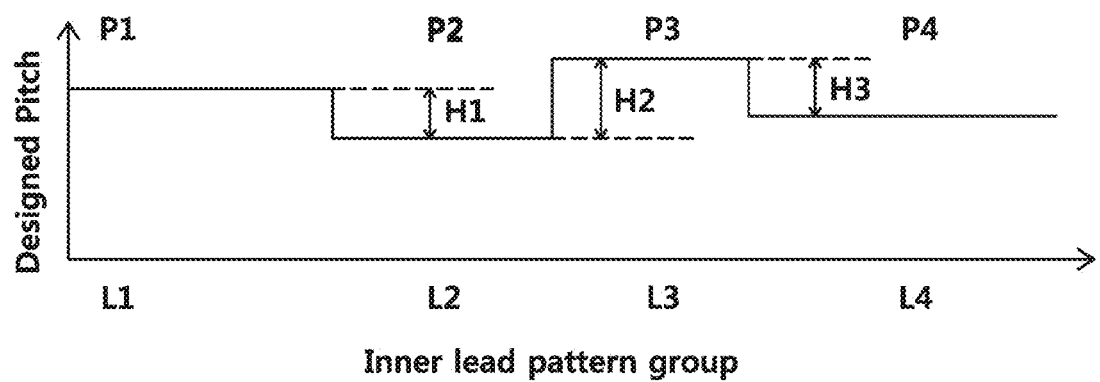
FIGS. 8A and 8B illustrate an example in which the numbers of inner lead patterns on a flexible film are different in a semiconductor package according to one or more examples.
Figure 8B:
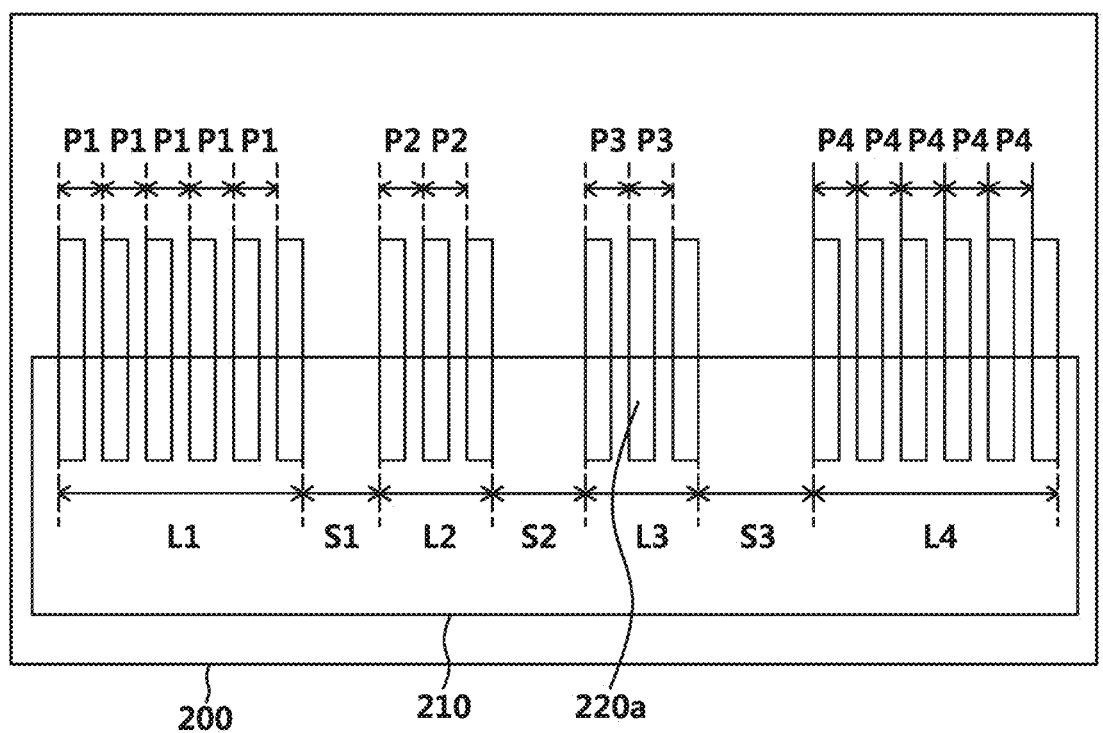

FIGS. 8A and 8B illustrate an example in which the number of inner lead patterns within the inner lead pattern groups on a flexible film is changed in a semiconductor package according to an example.

As shown in FIG. 8B, the number of inner lead patterns in each inner lead pattern group may be different from each other. For example, group L2 may have 20 inner lead patterns, L3 may have 30 inner lead patterns, and L4 may have 20 inner lead patterns. For convenience of explanation, the pitch value in FIG. 8 is omitted as the description is similar to that of FIG. 7.

Figure 9A:
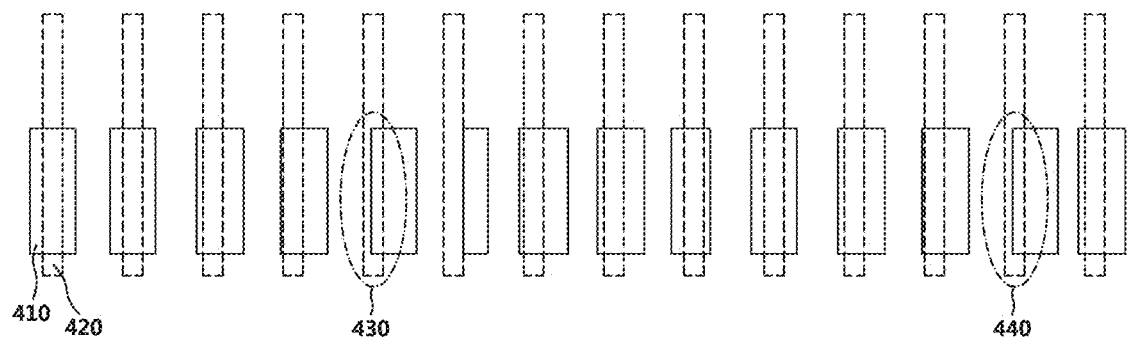
FIG. 9A illustrates an example in which an inner lead pattern region of a film and a bump region of a semiconductor chip may be misaligned.
Figure 9B:
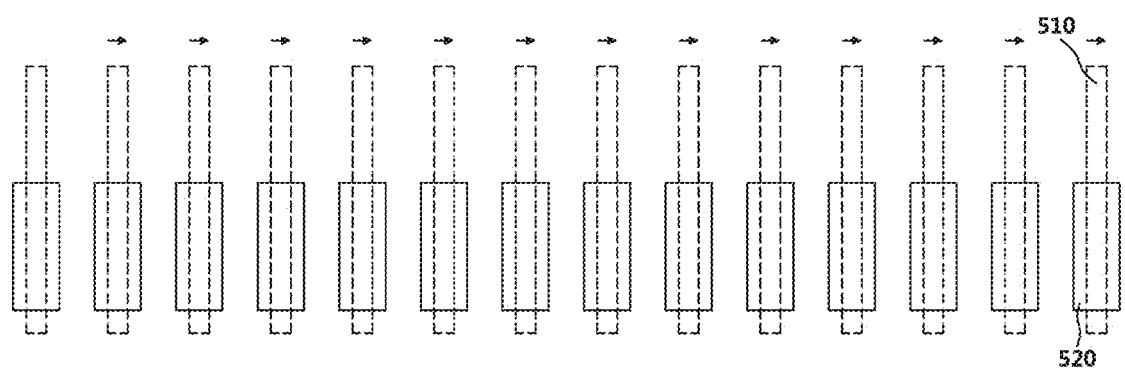
FIG. 9B illustrates an example in which an inner lead pattern region of a film and a bump region of a semiconductor chip are aligned in a semiconductor package according to one or more examples.

FIG. 9A illustrates an example in which the inner lead pattern region of the flexible film and the bump region of the semiconductor chip may be misaligned, and FIG. 9B illustrates an example in which the inner lead pattern region of the flexible film and the bump region of the semiconductor chip are aligned with each other in a semiconductor package according to an example.

Referring to FIG. 9A, when the bumps 410 are arranged at regular distances, the inner lead pattern 420 of the film may be manufactured by applying a variable pitch in a specific section and applying the same pitch in the remaining section. In the example of the final pattern between the same-pitch sections, there is a high possibility that shift occur (430, 440). In the example the pattern of the bumps and the pattern of the conductive interconnections in consideration of the coefficient of thermal expansion may be manufactured so as to fundamentally prevent misalignment, by preventing a shift that may occur between the same pitch sections.

Referring to FIG. 9B, the inner lead pattern 510 of the film with respect to the bump 520 pattern having a uniform distance may be manufactured based on the metal interconnection density per unit area in the semiconductor chip or in consideration of the coefficient of thermal expansion of each of the bump 520 or the inner lead pattern 510. In this example, the bump pattern 520 and the inner lead pattern 510 may be aligned on the right position with each other in all of the sections.

Figure 10A:
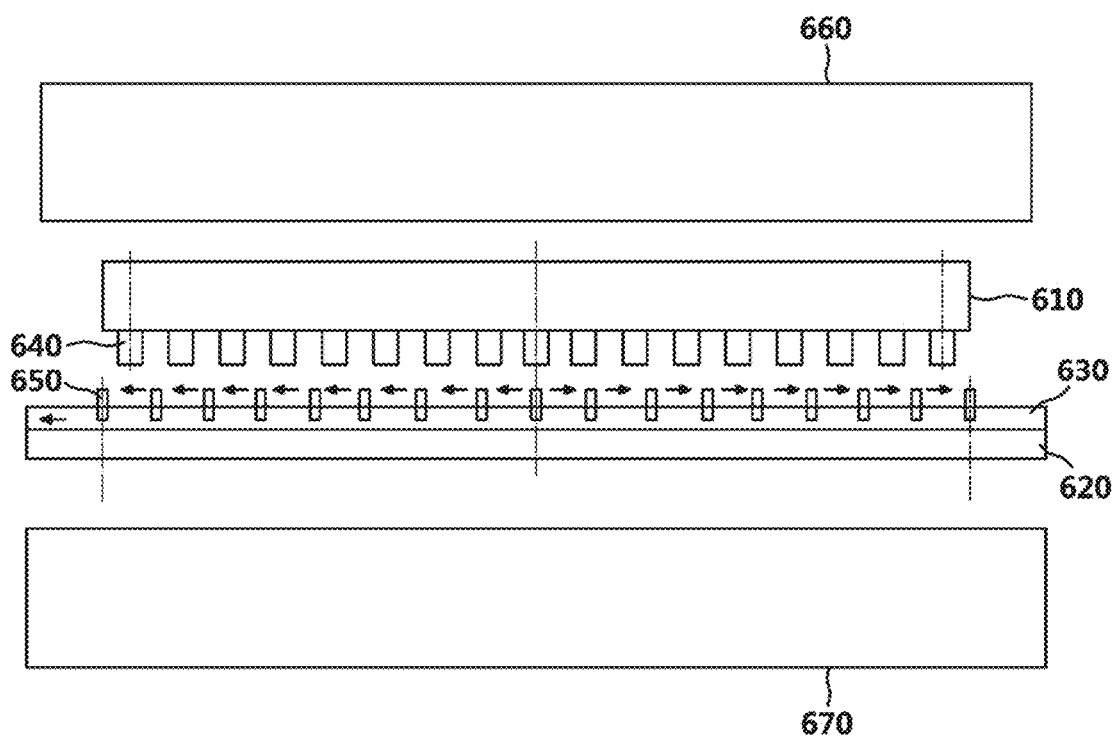
FIG. 10A illustrates a semiconductor package according to one or more examples before a COF packaging process is applied.

FIG. 10A illustrates a semiconductor package according to an example before the COF packaging process is applied.

Referring to FIG. 10A, a semiconductor package may include a semiconductor chip 610 and a film 620, an insulating layer 630 disposed on the film 620, bumps 640 attached to the semiconductor chip 610, and inner lead patterns 650 attached to the insulating layer 630. The bonding tool 660 of a high temperature and a compression stage 670 may be used for bonding the semiconductor chip 610 and the film 620 to each other.

The semiconductor package may be configured with the semiconductor chip 610 mounted on the film 620. At this time, the inner lead pattern 650 attached to the insulating layer 630 on the film 620 and the bumps 640 attached to the semiconductor chip 610 may be aligned with each other. According to an example, the alignment may be made in consideration of the metal interconnection density in the semiconductor chip or the coefficient of thermal expansion of each of the bumps or inner lead patterns.

When bonding the semiconductor chip 610 and the film 620 to each other, the bonding tool 660 at high temperature and the compression stage 670 may be used. At this time, the semiconductor chip 610 may be expanded by the heat of the bonding tool 660, and the film 620 may be expanded by the compression stage 670.

According to an embodiment, an array of the plurality of bumps and the array of the plurality of inner lead patterns may be manufactured based on the temperatures of the bonding tool 660 and the corresponding compression stage 670 respectively, when manufacturing the pattern of the bumps 640 and the inner lead pattern 650 of the semiconductor package.

According to an embodiment, when the pattern of the bumps 640 and the inner lead pattern 650 of the semiconductor package are manufactured, the array of the plurality of bumps 640 may determine the pitch with respect to the center of the semiconductor chip 610. (The pitch of the array of the plurality of bumps 640 may be determined with respect to the center of the semiconductor chip 610)

Figure 10B:
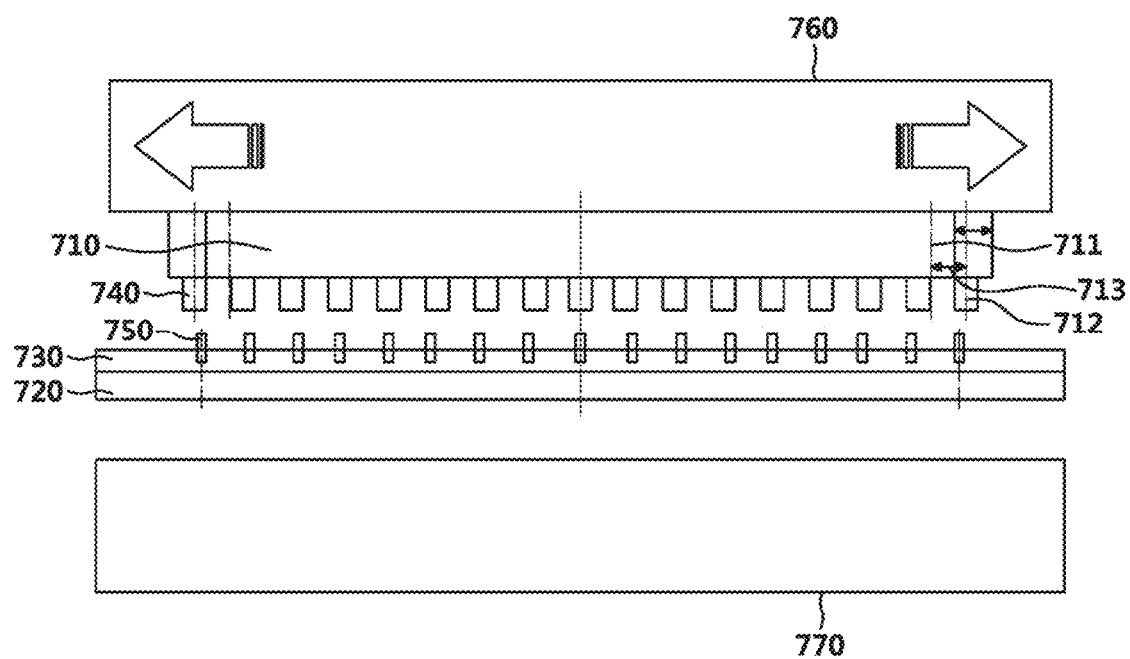
FIG. 10B illustrates a state in which the heat is applied by a bonding tool only to a semiconductor chip among a film and a semiconductor chip when a semiconductor package according to one or more examples is manufactured.

FIG. 10B illustrates a state in which the heat is applied by the bonding tool only to the semiconductor chip among the film and the semiconductor chip, when the semiconductor package according to an embodiment of the present disclosure is manufactured.

Referring to FIG. 10B, the semiconductor package may include a semiconductor chip 710 and a film 720, an insulating layer 730 disposed on the film 720, bumps 740 attached to the semiconductor chip 710, and inner lead patterns 750 attached to the insulating layer 730.

The bonding tool 760 of a high temperature and the compression stage 770 may be used for bonding the semiconductor chip 710 and the film 720 to each other. At this time, the semiconductor chip 710 of the semiconductor package may be expanded by the heat of the bonding tool 760. The variation 713 can be calculated from the difference between the initial position 711 of the bump attached to the semiconductor chip 710 before the heat is applied and the position 712 after thermal expansion.

Figure 10C:
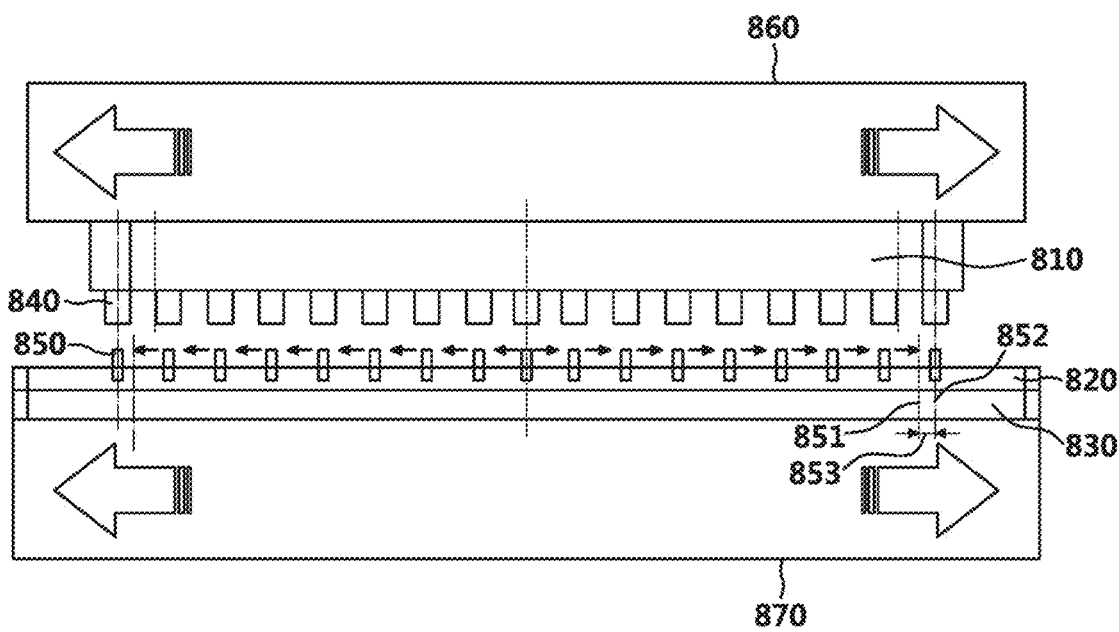
FIG. 10C illustrates an example of a state in which the heat of a bonding tool and a compression stage is applied to a film and a semiconductor chip when a semiconductor package according to one or more examples is manufactured.

FIG. 10C illustrates a state in which the heat of the bonding tool and the compression stage is applied to a film and a semiconductor chip when a semiconductor package according to an embodiment of the present disclosure is manufactured.

Referring to FIG. 10C, the semiconductor package may include a semiconductor chip 810 and a film 830, an insulating layer 820 on the film, bumps 840 attached to the semiconductor chip 810, and inner lead patterns 850 attached to the insulating layer 820.

The bonding tool 860 of a high temperature and the compression stage 870 may be used for bonding the semiconductor chip 810 and the film 830 to each other. The film 830 of the semiconductor package may be expanded by the heat of the compression stage 870. The variation 853 can be calculated from the difference between the initial position 851 of the inner lead pattern 850 attached to the insulator 820 on the film 830 before the heat is applied and the position 852 after the thermal expansion.

According to an embodiment, when the pattern of the bumps 840 and the inner lead patterns 850 of the semiconductor package are determined in consideration of the temperatures of the bonding tool 860 and the compression stage 870 corresponding the coefficient of thermal expansion of the semiconductor chip 810 and the film 830, respectively, the patterns of the bumps 840 and the inner lead patterns 850 intermesh exactly as shown in FIG. 10C.

Figure 10D:
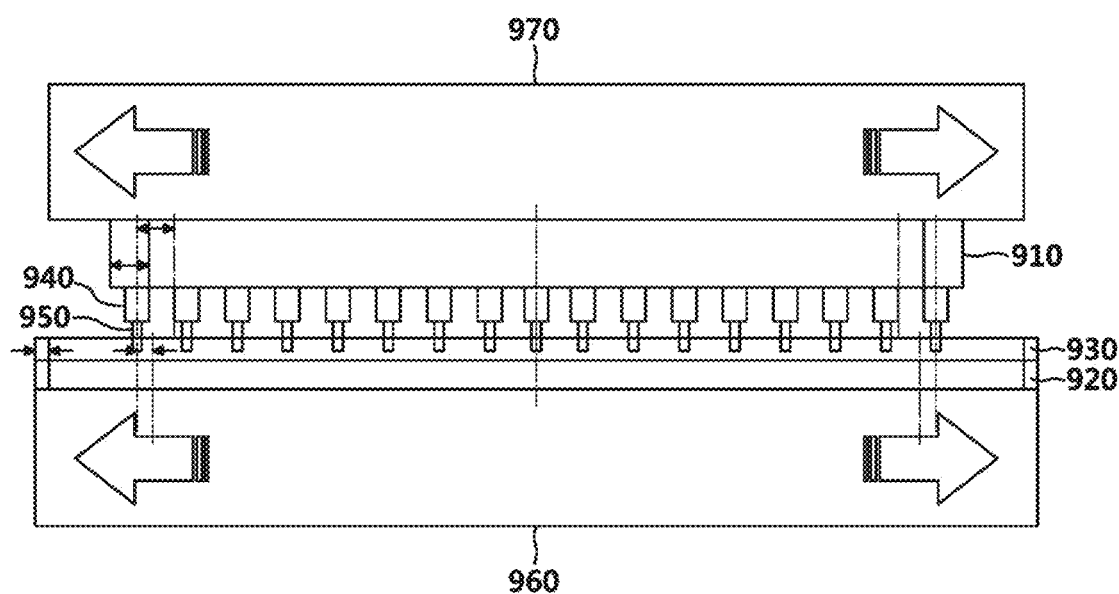
FIG. 10D illustrates a semiconductor package according to one or more examples after the COF packaging process is completed.

FIG. 10D illustrates a semiconductor package according to an example after the COF packaging process is completed.

Referring to FIG. 10D, the semiconductor package may include a semiconductor chip 910 and a film 920, an insulating layer 930 disposed on the film 920, bumps 940 attached to the semiconductor chip 910, and inner lead patterns 950 attached to the insulating layer 930. The bonding tool 960 of a high temperature and the compression stage 970 may be used for bonding the semiconductor chip 910 and the film 920 to each other. At this time, the semiconductor chip 910 and the film 920 of the semiconductor package are aligned by being expanded by the heat of the bonding tool 960 and the compression stage 970.

Figure 11A:
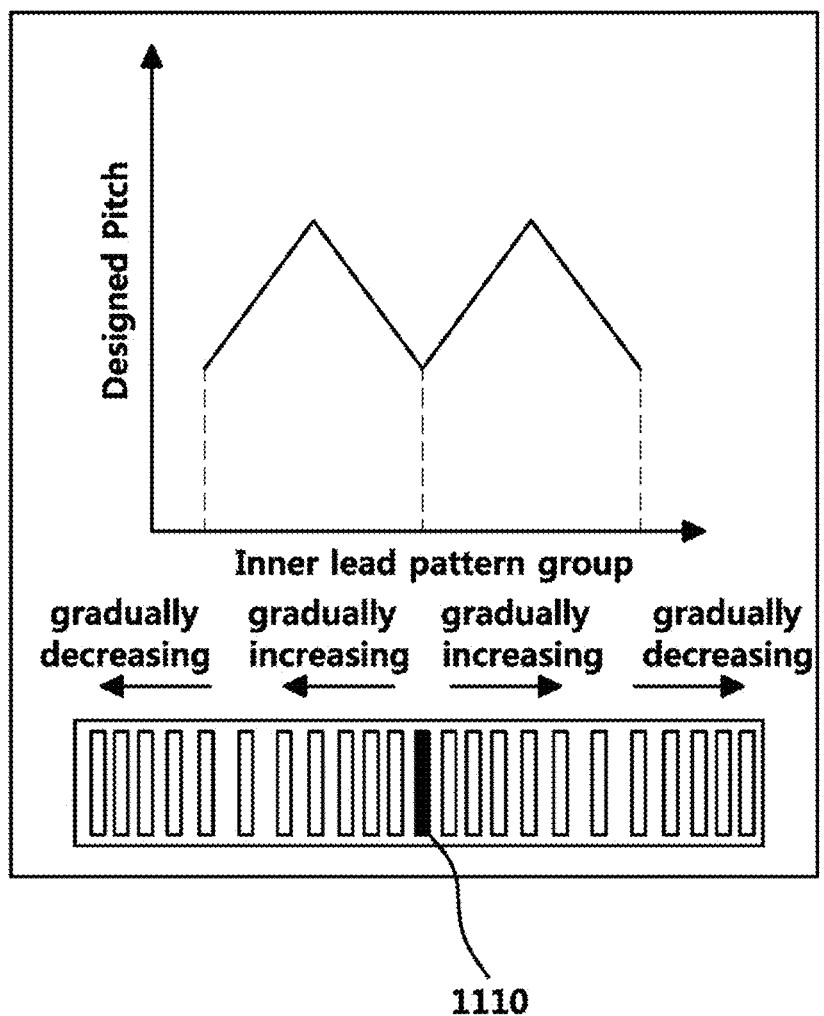
FIGS. 11A and 11B illustrate an example of the distance (pitch) between inner lead patterns in a semiconductor package according to one or more examples.
Figure 11B:
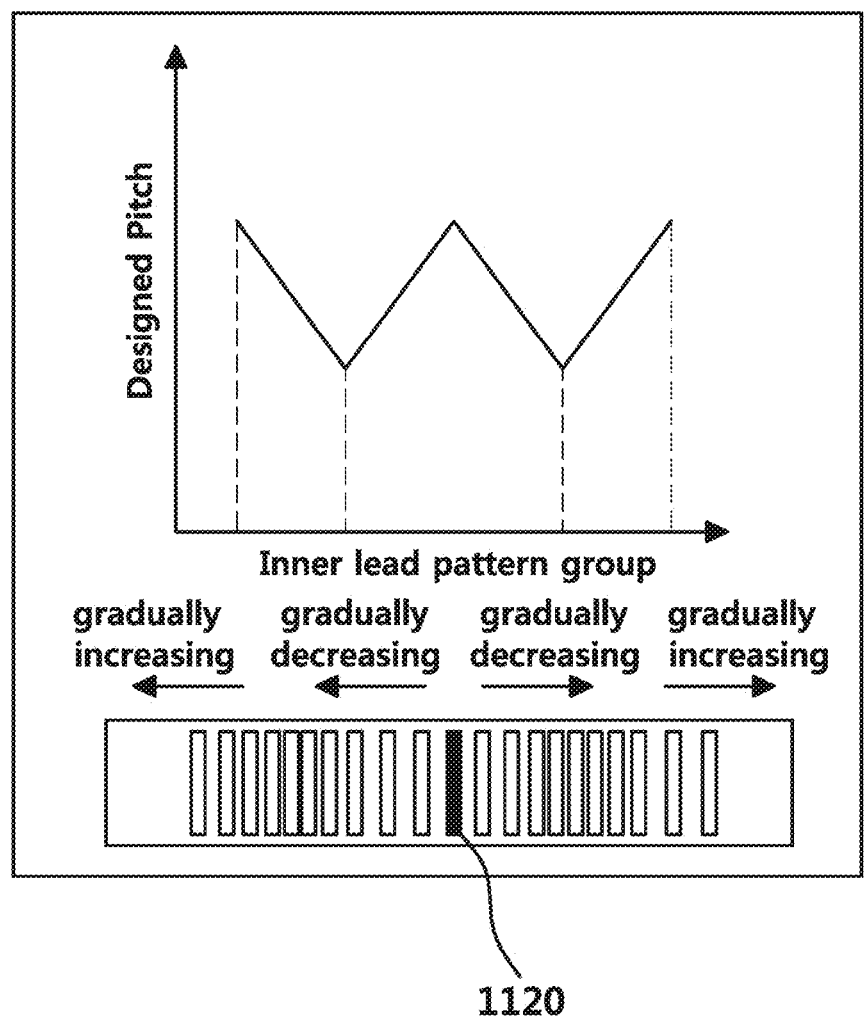

FIGS. 11A and 11B illustrate an example of a distance (pitch) between inner lead patterns in a semiconductor package according to an example.

For example, referring to FIG. 11A, the distances between the inner lead patterns may be determined so that the distances between the inner lead patterns thereof may be gradually increased from the center and then may be gradually decreased as the distance from the center 1110 increases, without having the same pitch. In this example, the bumps of the semiconductor chip may be determined with respect to the center 1110, and the lengths of the distances between the bumps may be gradually increased with respect to the center 1110 and then may be gradually decreased as the distance from the center 1110 increases.

As another example, referring to FIG. 11B, the distances of the inner lead patterns may be determined so that the length of the distances between the inner lead patterns thereof may be gradually decreased from the center 1120 and then may be gradually increased as the distance from the center 1120 increases. In this example, the distances of the bumps of the semiconductor chip may be arranged so that the lengths of the distances between the bumps may be gradually decreased with respect to the center 1120, and then may be gradually increased as the distance from the center 1120 increases.

Figure 12A:
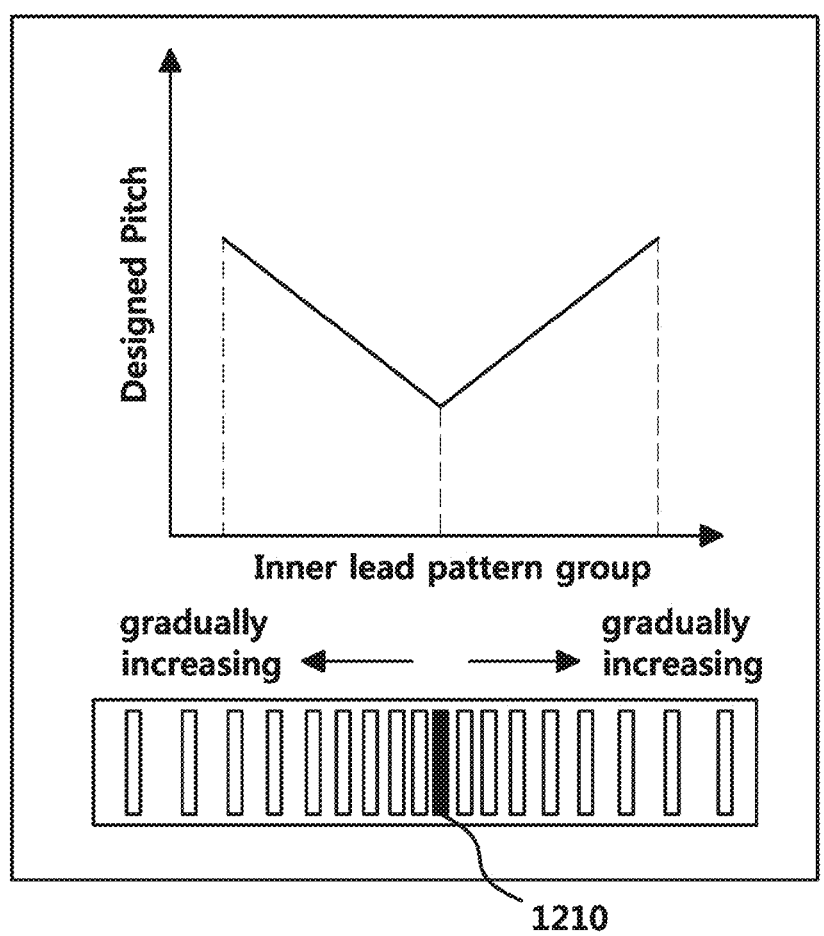
FIGS. 12A and 12B illustrate an example of the distance (pitch) between inner lead patterns in a semiconductor package according to one or more examples.
Figure 12B:
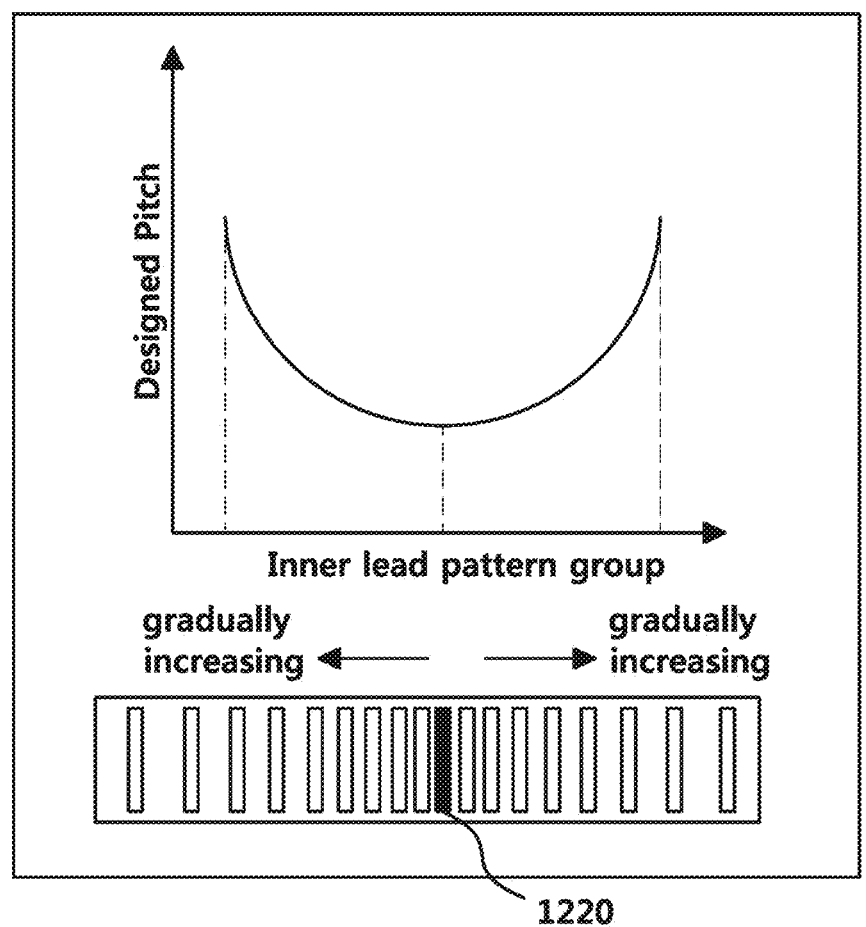

FIGS. 12A and 12B illustrate an example of a distance (pitch) between inner lead patterns in a semiconductor package according to another embodiment of the present disclosure.

For example, referring to FIG. 12A, the distances between the inner lead pattern may be determined so that the distances thereof may be gradually increased linearly from the center 1210 without having the same pitch section. In this example, the bumps of the semiconductor chip may be determined with respect to the center 1210, and the distances between the bumps may be arranged so that the lengths of the distances thereof may be increased linearly with respect to the center 1210.

As another example, referring to FIG. 12B, the distances between the inner lead patterns may be determined so that the length of the distances between the inner lead patterns thereof may be increased exponentially from the center 1220. In this example, the bumps of the semiconductor chip may be arranged so that the lengths of the distances thereof may be increased gradually as the distance from the center 1220 increases.

Figure 13A:
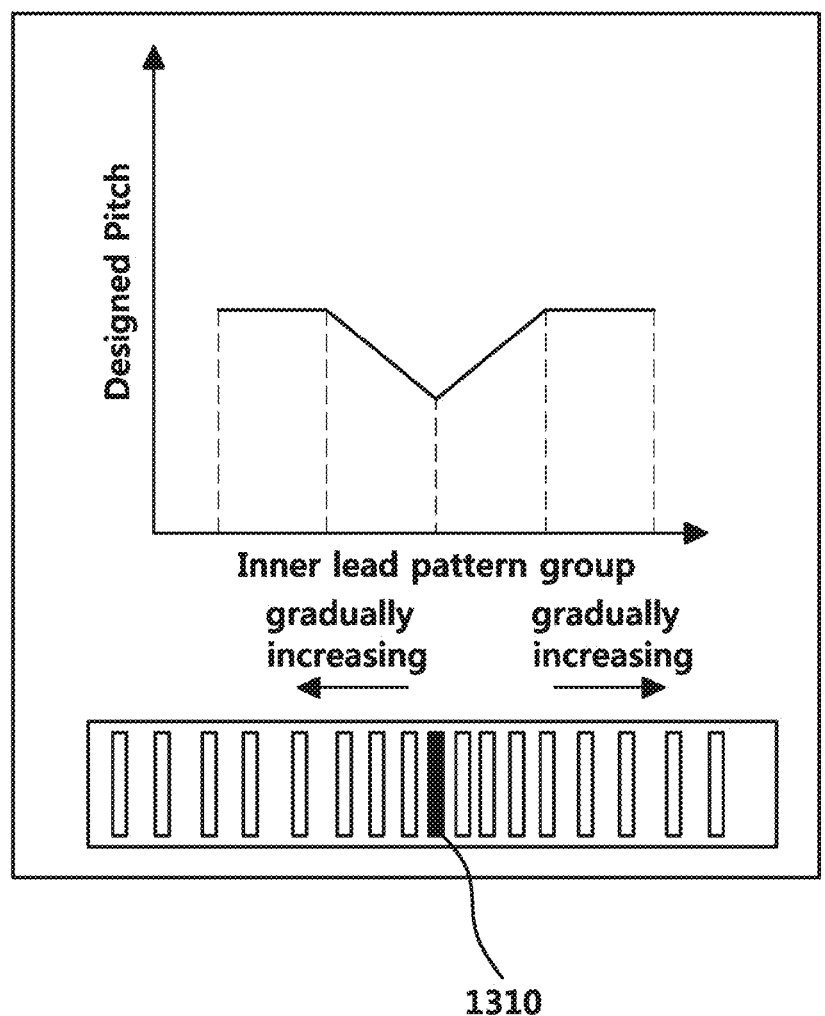
FIGS. 13A and 13B illustrate an example of the distance (pitch) between inner lead patterns in a semiconductor package according to one or more examples.
Figure 13B:
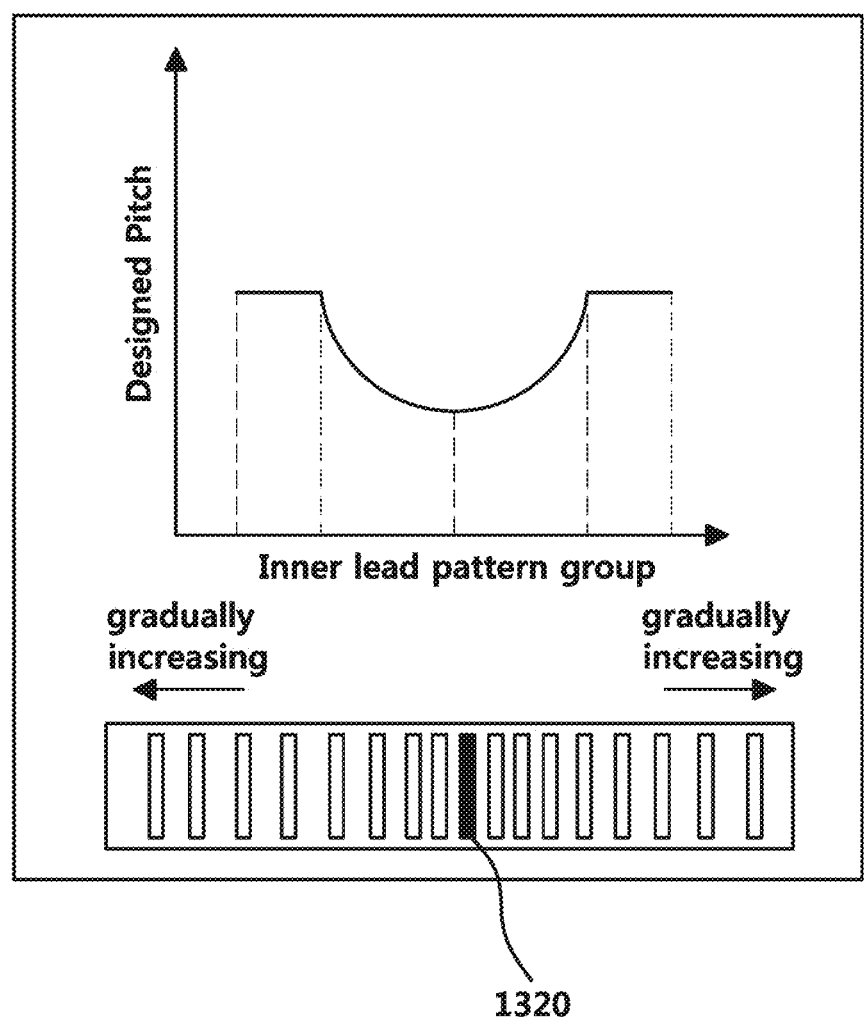

FIGS. 13A and 13B illustrate an example of a distance (pitch) between inner lead patterns in a semiconductor package according to another embodiment of the present disclosure.

For example, referring to FIG. 13A, the length of the distances between the inner lead patterns may be determined so that the length of the distances thereof may be gradually increased linearly from the center 1310, and then may have the same pitch at a predetermined position. In this example, the bumps of the semiconductor chip may be determined with respect to the center 1310, and the lengths of the distances between the bumps may be gradually increased with respect to the center 1310 so as to correspond to the inner lead patterns.

As another example, referring to FIG. 13B, the distances between the inner lead patterns may be determined so that the lengths of the distances between the inner lead patterns thereof may be increased exponentially from the center 1320 and then may have the same pitch. In this example, the bumps of the semiconductor chip may be arranged so that the lengths of the distances may be increased gradually as the distance from the center portion 1320 increases.

The disclosed technique may have the following effects. It is to be understood, however, that the scope of the disclosed technology is not to be construed as limited thereby, as it is not meant to imply that a particular example should include all of the following effects or only the following effects.

The examples may prevent misalignment between the bumps of the semiconductor chip and the lead patterns notwithstanding the fact that the thermal expansion length varies according to the metal interconnection density of the semiconductor chip.

The examples may prevent misalignment caused by the coefficient of thermal expansion by varying the distances between the bump patterns of the semiconductor chip and the inner lead patterns of the flexible film.

The examples may have an electrical short protection caused by a misalignment of the wiring connection between the semiconductor chip and the display device according to the examples, and improve the reliability of the display device.

The effects according to the examples are not limited by the contents exemplified above, and more various effects are included in the present specification.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A semiconductor package, comprising:
   a semiconductor chip comprising interlayer insulating films formed on a substrate;
   metal interconnections disposed in the interlayer insulating film;
   bumps connected to the metal interconnections;
   a flexible film; and
   inner lead pattern groups formed on the flexible film and respectively connected to the bumps, each inner lead pattern group comprising inner lead patterns,
   wherein a variable distance is applied between respective inner lead pattern groups, and a same pitch is applied between respective inner lead patterns in each inner lead pattern group, and
   wherein a number of lead patterns of each inner lead pattern group is the same.

2. The semiconductor package of claim 1, further comprising an insulating layer formed on an upper surface of the flexible film,
   wherein in the inner lead pattern groups, a pitch between each inner lead pattern group is different.

3. The semiconductor package of claim 1, wherein a pitch between each bump is the same.

4. The semiconductor package of claim 1, wherein a thermal expansion coefficient of the semiconductor chip is smaller than a thermal expansion coefficient of the flexible film.

5. The semiconductor package of claim 1, wherein a number of lead patterns of a first inner lead pattern group is equal to a number of lead patterns of a second inner lead pattern group.

6. The semiconductor package of claim 1, further comprising outer lead pattern groups formed on the flexible film, each outer lead pattern group comprising outer lead patterns respectively connected to the inner lead patterns.

7. The semiconductor package of claim 6, wherein the outer lead patterns comprise input wiring patterns and output wiring patterns,
   wherein the input wiring patterns are formed on the flexible film, and a first end of the input wiring patterns is located in an inner lead area to be electrically connected to the semiconductor chip, and
   wherein the output wiring patterns are formed on the flexible film, and a first end of the output wiring patterns is located in the inner lead area to be electrically connected to an output bump of the semiconductor chip.

8. The semiconductor package of claim 7, wherein a second end of the input wiring patterns is located in a first outer lead area to be electrically connected to an external printed circuit board (PCB) wiring, and
   wherein a second end of the output wiring pattern is located in a second outer lead area to be electrically connected to a gate pad or a data pad formed on a display panel.

9. A semiconductor package comprising:
   a semiconductor chip;
   bumps disposed on the semiconductor chip;
   a flexible film;
   an insulating layer formed on an upper surface of the flexible film; and
   inner lead pattern groups formed on the flexible film and respectively connected to the bumps, each inner lead pattern group comprising inner lead patterns,
   wherein a pitch between each inner lead pattern gradually increases or decreases from a center of the inner lead pattern.

10. The semiconductor package of claim 9, wherein the pitch between each inner lead pattern gradually increases from the center without having the same pitch.

11. The semiconductor package of claim 9, wherein the inner lead pattern groups are disposed to overlap the semiconductor chip.

12. A semiconductor package comprising:
    a semiconductor chip;
    bumps disposed on the semiconductor chip;
    a flexible film;
    an insulating layer formed on an upper surface of the flexible film; and
    inner lead pattern groups formed on the flexible film and respectively connected to the bumps, each inner lead pattern group comprising inner lead patterns,
    wherein a pitch between each inner lead pattern increases exponentially from a center of the inner lead pattern groups without having a same pitch section.

* * * * *